United States Patent
Ludwig et al.

(10) Patent No.: US 6,218,846 B1
(45) Date of Patent: Apr. 17, 2001

(54) MULTI-PROBE IMPEDANCE MEASUREMENT SYSTEM AND METHOD FOR DETECTION OF FLAWS IN CONDUCTIVE ARTICLES

(75) Inventors: Reinhold Ludwig, Worcester; John A. McNeill, Stow; Jennifer A. Stander, Boylston, all of MA (US)

(73) Assignee: Worcester Polytechnic Institute, Worcester, MA (US)

( * ) Notice: Subject to any disclaimer, the term of this patent is extended or adjusted under 35 U.S.C. 154(b) by 0 days.

(21) Appl. No.: 08/904,789

(22) Filed: Aug. 1, 1997

(51) Int. Cl.$^7$ ............................................. G01R 27/00

(52) U.S. Cl. .................... 324/713; 324/715; 324/718

(58) Field of Search .................. 324/713, 715, 324/718, 722, 724

(56) References Cited

U.S. PATENT DOCUMENTS

| | | | |
|---|---|---|---|
| 4,178,543 | * 12/1979 | Wrinn | 324/718 |
| 4,667,149 | 5/1987 | Cohen et al. . | |
| 4,888,546 | * 12/1989 | Berry | 324/718 |
| 5,136,252 | 8/1992 | Witt . | |
| 5,227,731 | 7/1993 | Prabhakaran et al. . | |

OTHER PUBLICATIONS

Anonymous, "AT&T Microhmeter User Guide", AT&T Product Manual, Feb. 1986.
A.D. Seagar, et al., "Theorectical limits to sensitivity and resolustion in impedance imaging", Clin.Phys.Physiol.Meas., 1987, vol. 8, Suppl. A, p.13–31.
B.H.Brown, et al., "The Sheffield data collection system", Clin.Phys.Physiol.Meas., 1987, vol. 8, Suppl. A, p.91–97.
H.M.Powell, et al., "Impedance imaging using linear electrode arrays", Clin.Phys.Physiol.Meas., 1987, vol. 8, Suppl. A, p.109–118.
K. Ikeda, et al., "Electrical potential drop method for evaluatig crack depth", International Journal of Fracture 47:25–38, 1991.
P.R.Frise, et al., "Improved Probe Array for ACPD Crack Measurements", British Journal of NDT, vol. 34, No. 1, Jan. 1992, p.15–19.
Barend Van Den Bos, "The DC Potential Drop Method for Non Destructive Testing of P/M Components in Green and Sintered State", Jernkontorets Forskning, Final Report, Project No. 8076/92, Serie D (T080–37), Nr 750, Jun. 28, 1996.

(List continued on next page.)

*Primary Examiner*—Josie Ballato
*Assistant Examiner*—T. R. Sundaram
(74) *Attorney, Agent, or Firm*—R. Dennis Creehan

(57) ABSTRACT

An innovative multi-dimensional, low frequency, impedance measurement probe array, measurement system, and method are disclosed for detecting flaws in conductive articles. The device and method provide for contacting a conductive article with an multi-probe array of current and voltage probes, injecting current sequentially through a plurality of current probe pairs and measuring absolute or relative voltages with a plurality of voltage probes and voltage probe pairs across the surface of an article for each current flow condition. The device and method further provide for constructing a voltage profile across the surface of an article where disruptions in the voltage profile enable detection of the presence, location and orientation of flaws for flaw sizes as low as 20 um. The innovative probe array and method provide for rapidly detecting cracks, inclusions, defects and other flaws in conductive articles and can be adapted and deployed as either a two-dimensional, planar array or three-dimensional shaped array for a variety of sample configurations and surfaces. By utilizing a plurality of current and voltage probes in an array format, the device and method overcomes existing limitations of conventional linear probes and traditional methods by enabling flaw detection over larger areas in a single probe placement while achieving a high degree of sensitivity and precision in determining flaw location and orientation.

33 Claims, 26 Drawing Sheets

OTHER PUBLICATIONS

R.L. Cohen, et al., "Characterization of Metals and Alloys by Electrical Resistivity Measurements", Materials Evaluation/ 41/ Aug. 1983, p. 1074–1077.

Leander F. Pease III, Flaw Detection in P/M Parts via Real Time X–Ray Analysis, Eddy Currents, and Electrical Resistivity, 1988 Int. Powder Metallurgy Conf., MPIF (Princeton, NJ, 1988) p. 105–125.

Anna Lewis, et al., "Resistivity Measurement for Evaluation of Coating Thickness", Materials Evaluation / Feb. 1991, p. 132–135.

Leander F. Pease III, "Crack Detection in Green and Sintered P/M Parts", 1992 Powder Metallurgy World Congress, San Francisco, CA, Jun. 21–26, 1992, p. 1–24.

Duane P. Johnson, et al., "Nondestructive Flaw Detection and Density Measurements in Powder Metallurgy Parts", Advances in P/M and Particulate Materials, vol. 2, MPIF (Princeton, NJ, 1992) p. 281–289.

R.E. Shannon, et al., "Nondesctructive Evaluation for Large–Scale Metal–Matrix Composite Billet Processing", Metallurgical Transactions A, vol. 23A, May 1992, p. 1541–1549.

Duane P. Johnson, "Nondestructive Flaw Detection and Density Measurements in Powder Metallurgy Parts—Part II", Industrial Heating / Aug. 1996, p. 41–45.

* cited by examiner

PRIOR ART
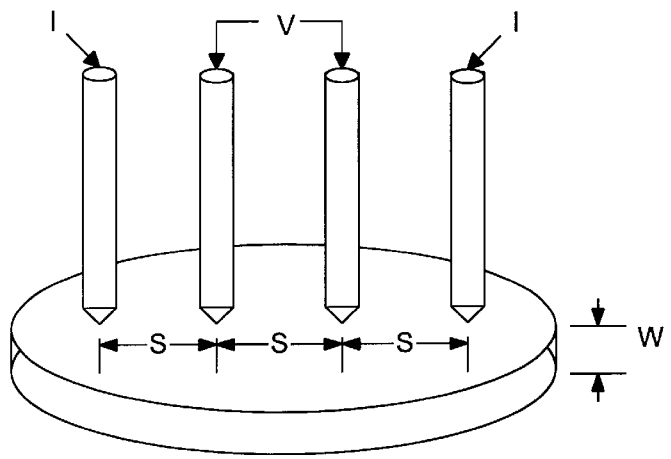
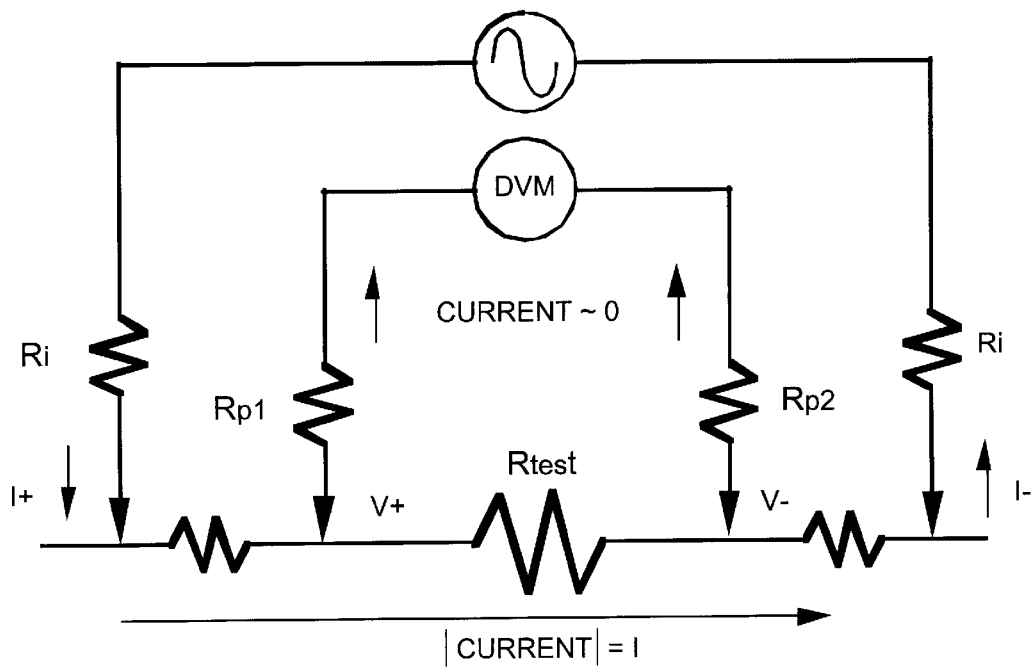
FIG. 1

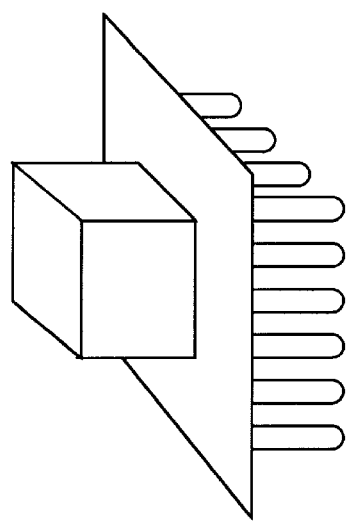
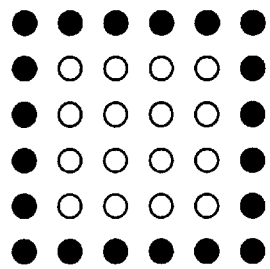
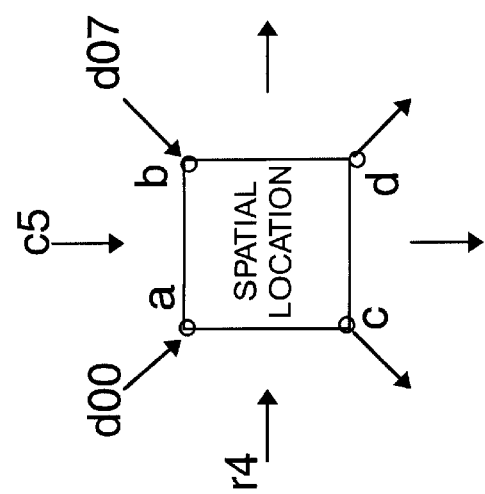
FIG. 4A

FIG. 9A-B

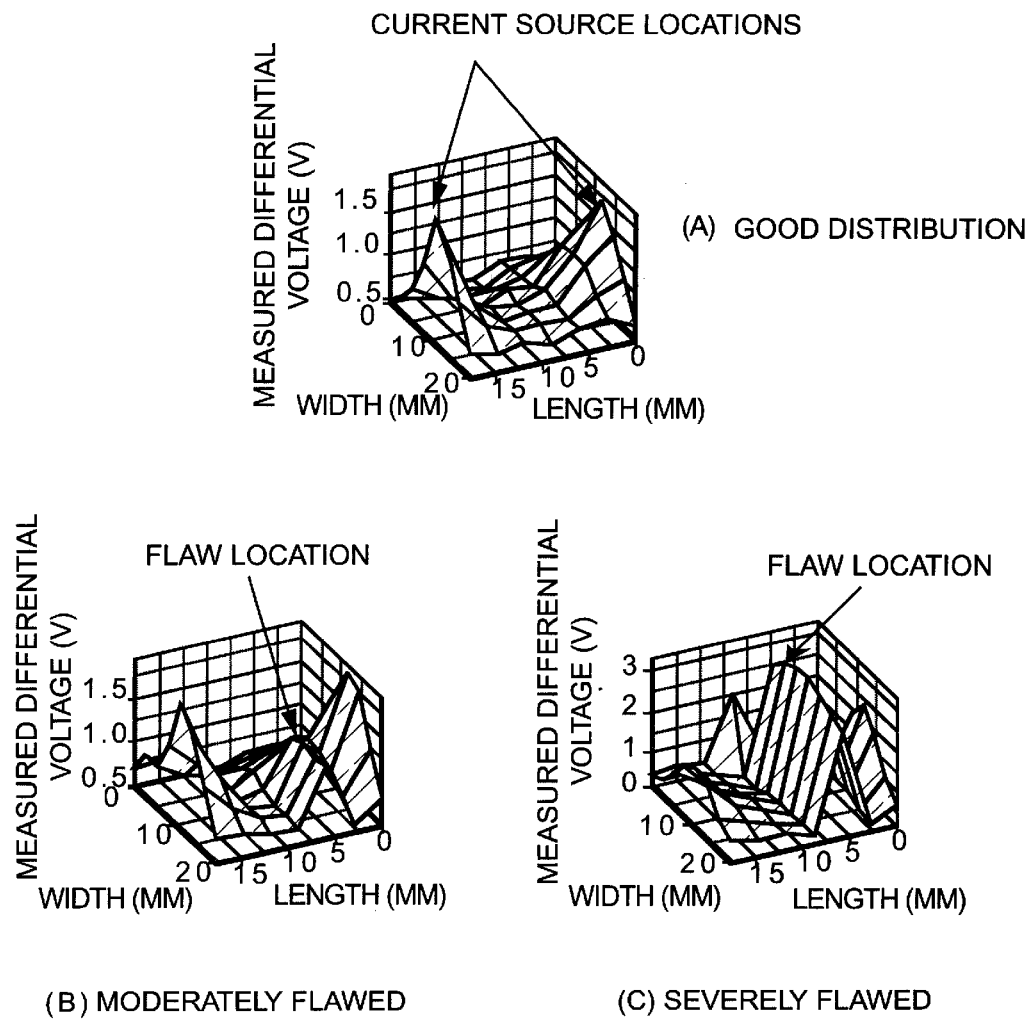
FIG. 21A-C

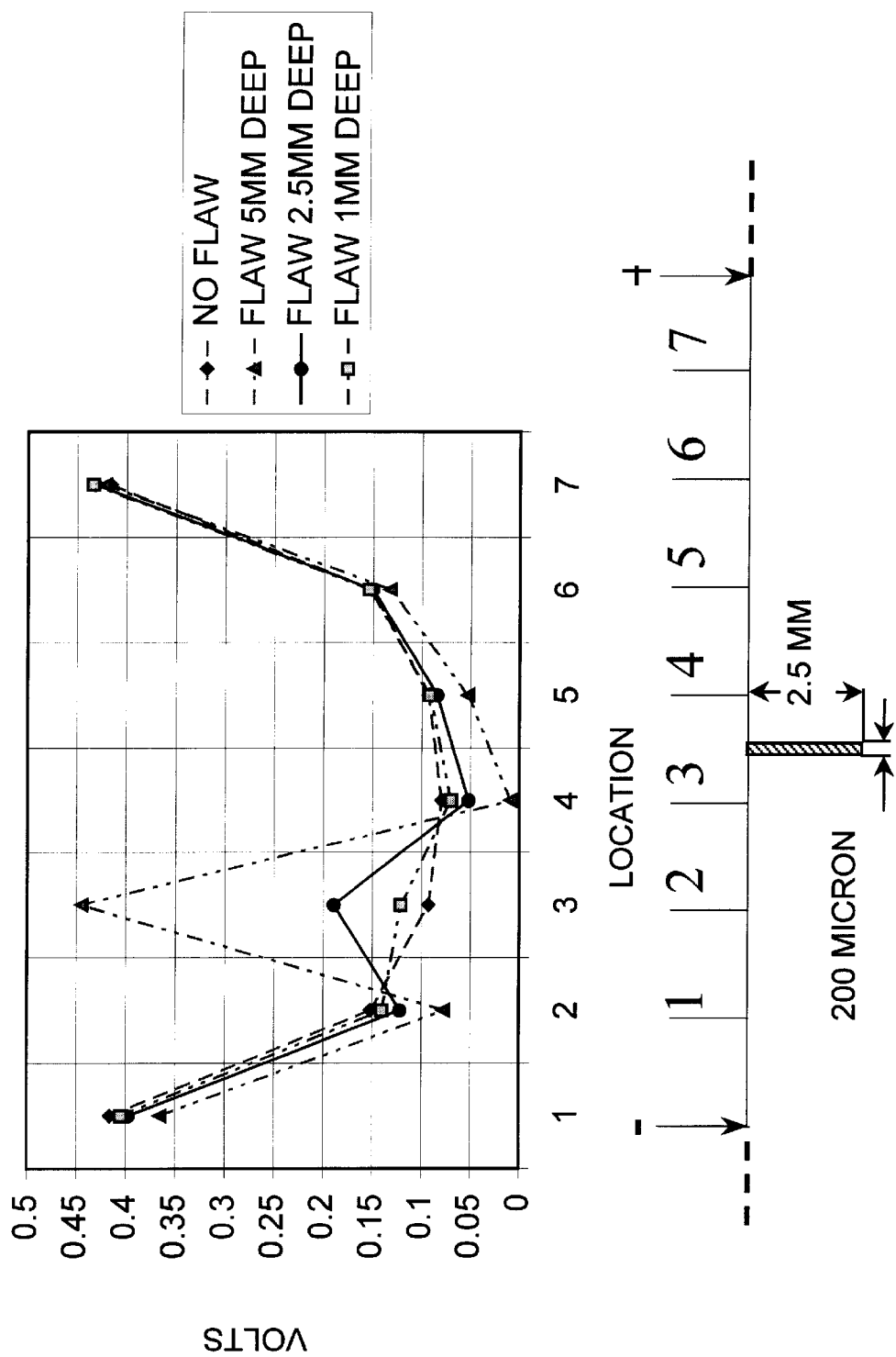

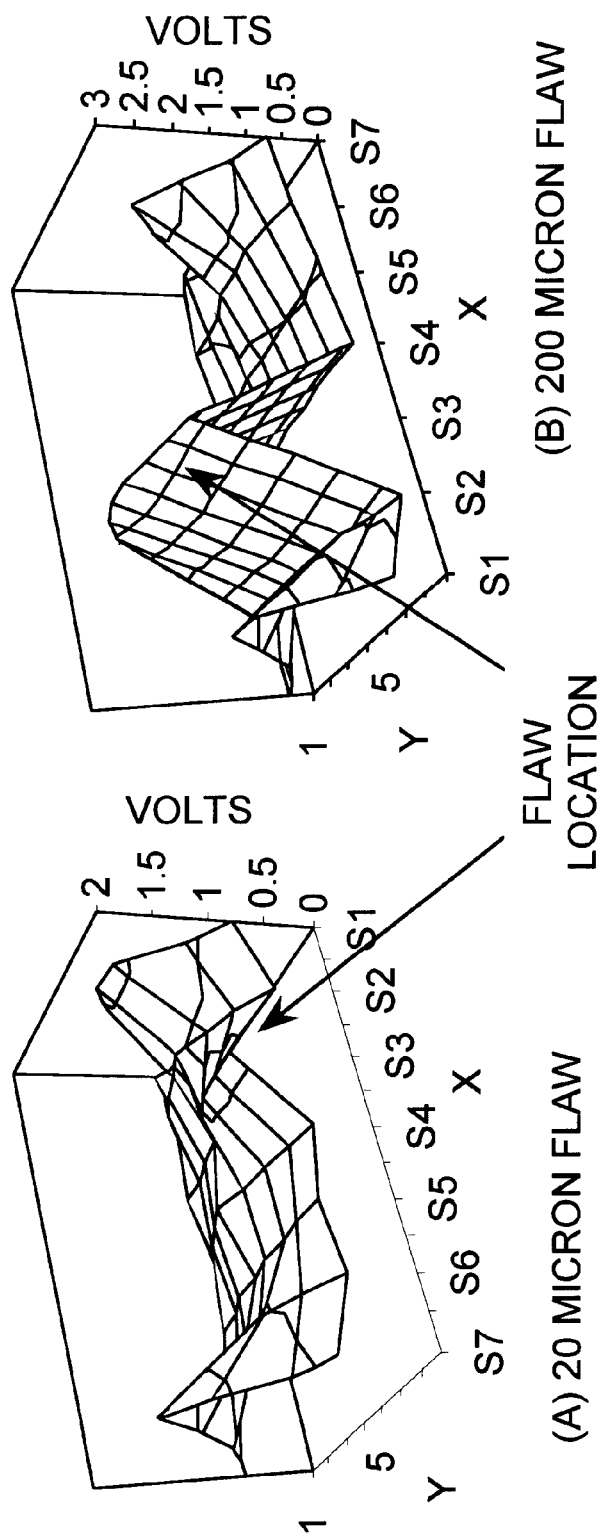
FIG. 23A-B

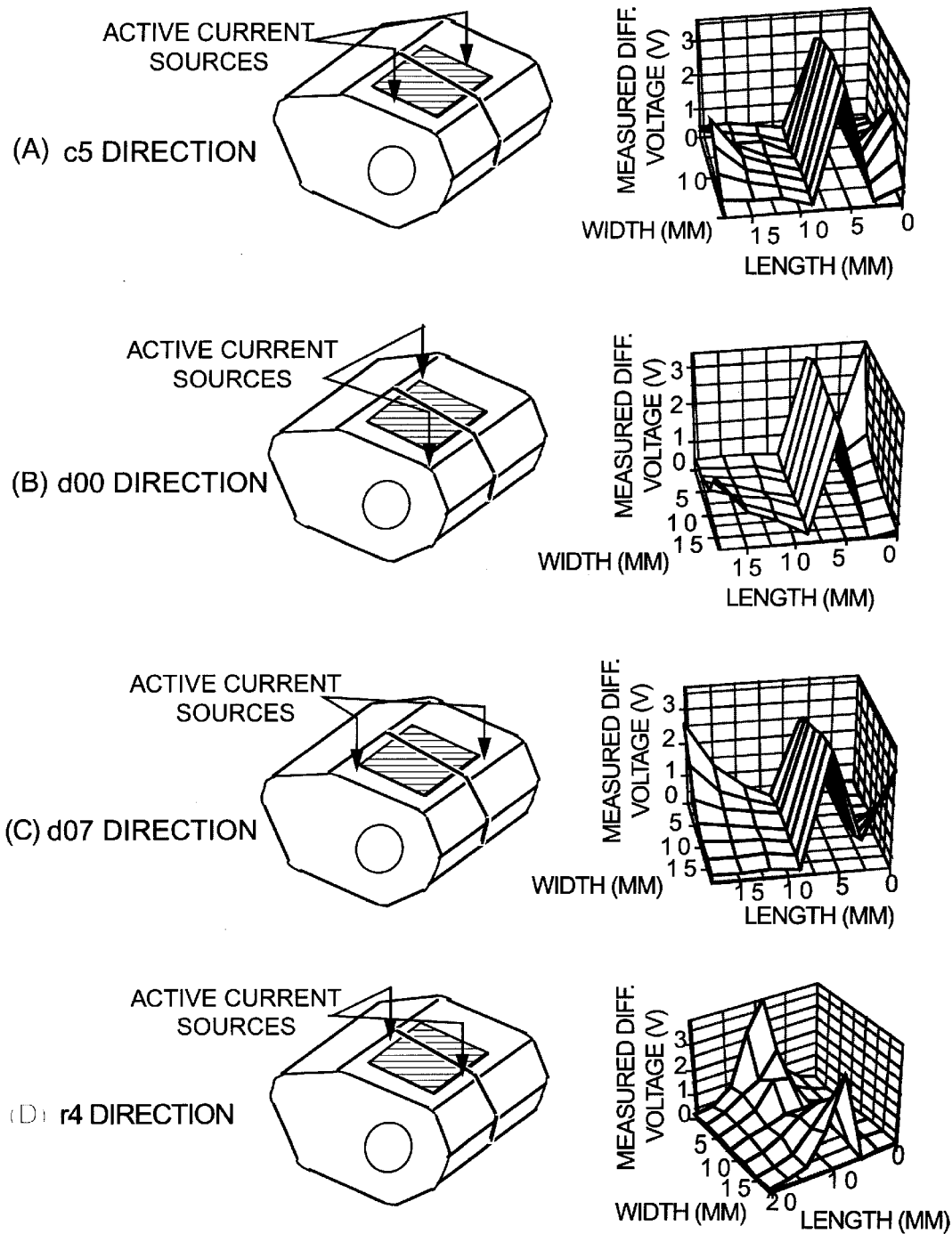
FIG. 24A-D

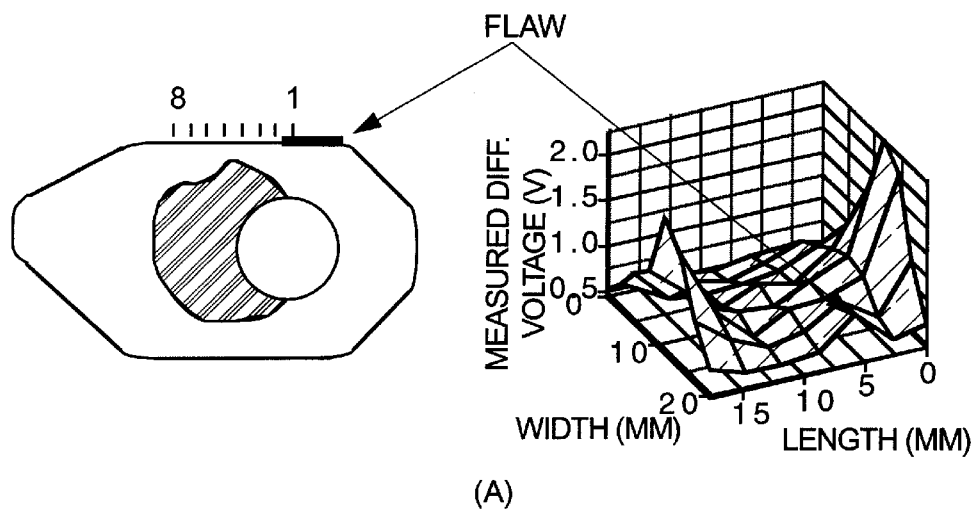
(A)
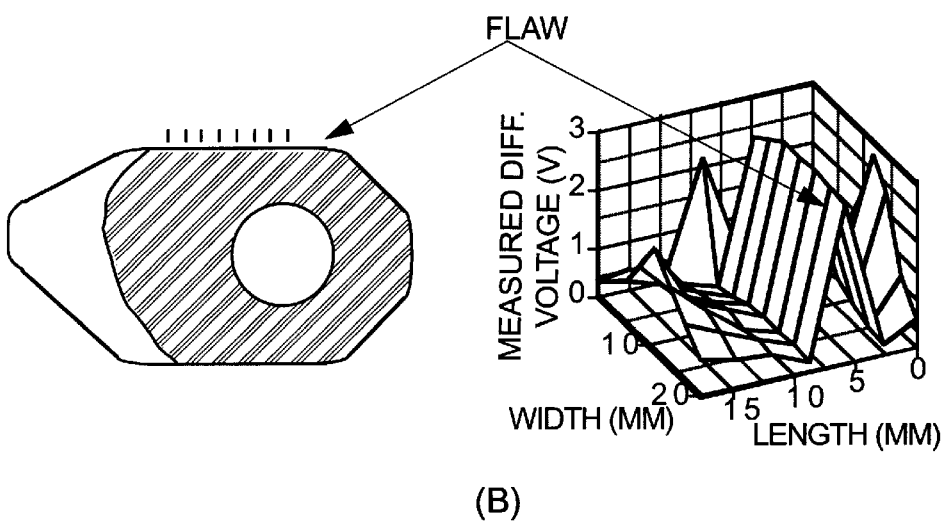
(B)
FIG. 25A-B

MULTI-PROBE IMPEDANCE MEASUREMENT SYSTEM AND METHOD FOR DETECTION OF FLAWS IN CONDUCTIVE ARTICLES

FIELD OF THE INVENTION

This invention relates to a system, apparatus and method for non-destructive testing of conductive articles for the detection and characterization of flaws.

BACKGROUND OF THE INVENTION

Electrical methods for non-destructive testing and measuring the resistivity of metals are well known. For example, the four point probe method, also known as the potential drop method, and the eddy current method are two widely-practiced techniques for measuring the resistivity of magnetic or non-magnetic metals, respectively.

Eddy current methods and instruments have been widely used for measurements of resistivity on non-magnetic steels and nonferrous alloys, such as aluminum. These measurements have also been used for detecting flaws and cracks in non-magnetic alloys. With this technique, no electrical contact with the sample is required. However, due to the significant influence of geometrical effects, this technique requires careful calibration for articles having complex shapes. In addition, the eddy current technique requires substantial corrections for samples having high relative magnetic permeability and therefore have limited applications for measurements of ferrous alloys or ferromagnetic materials.

The four point probe impedance method is widely used for measurements of resistivity on metal samples. A typical four point probe configuration and circuit schematic are shown in FIG. 1. Both direct current ("DC") and alternating current ("AC") embodiments of this method are known in the art. The four-point probe apparatus typically comprises two pairs of probes arranged in a straight line which make electrical contact with the sample to be measured. Two current probes are positioned at either end of the linear array and two voltage probes are placed between the current probes in a collinear arrangement. A current source, either AC or DC, is connected to the current probes to supply a predetermined flow of current through the sample article and the voltage differential between the voltage probe locations is measured and recorded. The resistivity can be determined from the apparent resistance of the sample region located between the voltage probes is determined by applying the familiar Ohm's Law relation, V=IR, where V is the measured voltage, I is the applied current and R is sample resistance. The resultant measured resistivity value is thus a derived absolute value which is significantly influenced by the specific measurement conditions and specific characteristics of the sample being measured.

The apparent resistivity of the sample which is measured by the four point technique is dependent on sample composition, bulk resistivity of the material, geometry and shape of the part and the presence of physical defects, such as voids, cracks and inclusions within the sample volume which is measured. Thus, the method may be used for quality control of sample lots for checking uniformity of the lot composition by measurement of variations of resistivity between samples. Due to the large changes in resistivity produced by annealing treatments or work hardening of complex alloys, the method has been used to determine the extent of alloy phase transformation, such as the austenitic-martensitic transition in ferrous alloys. In addition, the method has been utilized to test the quality of semiconductor materials, magnetic steels and alloys, transformer steels, electroplated coatings, spot welds to gauge uniformity in sheet steel roll stock.

If a sample part has a standard geometry and the sample composition and microstructure is uniform, the effects of composition, microstructure and shape on a four point probe resistivity measurement can be factored into an apparent baseline measurement values for the specific part and deviations from the baseline value can be used to determine the presence of unacceptable defects within the article. However, for detecting such defects, the four point technique requires careful calibration by measuring the resistivity of an acceptable flaw-free sample which is free of any defects. The voltage value thus measured with a defect-free part is then utilized for comparison with a defective part.

Due to the inherent limitations of typical four point measurement probe configurations, the area and effective volume which is sampled in a four point method measurement is limited by the use of a single or dual two voltage probe pairs of fixed spacing. In establishing an apparent baseline resistivity value, a single four point measurement is typically insufficient for detecting flaws in most articles due to the intrinsic heterogeneity of the sample and limited area sampled by the four point probe. Thus, the four point method requires repeated measurements at numerous points on the sample for calculation of an average baseline value.

An additional limitation in the method is that the measurement of absolute resistivity by this method necessarily assumes a fixed geometrical relationship for the derivation of a resistivity value for a specific probe spacing and sample thickness. Typically, when the actual sample part thickness and probe spacing values do not satisfy such geometric assumptions, the four point method requires application of significant correction factors which lead to further error and lack of precision in determining a sample's resistivity distribution. Such errors will typically mask deviations from baseline measurements due to the presence of flaws in the sample.

Due to the need for measuring and establishing a baseline resistivity value for an unflawed part, the four point probe method has significant additional limitations when used to determine the presence of defects in heterogeneous materials. Due to resistivity variations typically observed in flaw-free materials caused by lot to lot variations in manufacturing methods, annealing treatments, work hardening, grain size, multiple phases, localized compositional inhomogeniety and complex geometry, as routinely encountered in practical applications, such factors tend to mask variations from the baseline resistivity measurement which would enable the detection of flaws in samples. Thus, it is difficult to establish a baseline resistivity measurement with acceptable precision to enable the detection of defects and flaws in such parts. Thus, the calibration required for the four point probe method leads to imprecision and significantly limits the capability of the technique for detecting flaws in conductive articles.

A further limitation of the four point method is that the volume of material sampled in a typical measurement is limited to the material between the narrowly spaced voltage probes. Thus, measurements made by this method are frequently subject to a lack of reproducibility when measurements are made over a large sample surface area on heterogeneous, multi-phase, or porous samples, or where variations in composition or grain size are present. Measurements made by this method on such materials can lead to considerable uncertainty as to what the appropriate baseline resistivity distributors is for an unflawed part. Thus, such variations in measured values preclude the detection of flaws where the perturbation in the measured voltage distribution for a defective part is masked by the scatter and uncertainty in measured values for a flaw-free part.

SUMMARY OF THE INVENTION

The invention relates to a system, apparatus and method for non-destructive testing of conductive articles for detecting both the presence of flaws as well as the location, size and orientation of flaws within such articles. The apparatus and method of the present invention are found to be particularly useful, for the measurement and detection of flaws in articles or materials which are heterogeneous, multi-phase, or contain significant porosity. The apparatus and method of the present invention have particular value in non-destructive electrically conductive materials having a volume resistivity of greater than 10,000 microhm-cm.

The method of the present invention comprises contacting portions of the surface of a conductive sample with a sensor probe array having a minimum of six probes, comprising at least three current probes and at least three voltage probes, of either uniform or non-uniform spacing in a predetermined arrangement pattern. The number, location and spacing of current probes and voltage probes may be varied for a particular measurement application and are adaptable to the geometry, size and electrical characteristics of a given sample. The probe array contact points may be arranged in either a substantially planar, two-dimensional configuration for contact with a flat sample surface, or, alternatively, the probe array may be arranged in an essentially three-dimensional configuration for contact with angular, curved or irregular sample surfaces.

In a preferred embodiment, the sample to be measured is positioned in an insulated holder which is adapted to secure the sample and conform to the sample geometry so as to provide for both reproducible placement of the probe array on the sample and reproducible measurement results. This preferred feature is particular necessary for production line testing of components. The probe array is then brought into contact with the surface by an activator means. In one embodiment, the activator means comprises an arbor press with a modified ram to accommodate the probe sensor array. In a preferred embodiment, a mechanical or electrical force gauge is used in combination with the activator means to provide for adjustment of the contact pressure of the probe array on the sample to be measured.

The probe array comprises both current probes, which provide current flow to the sample being measured, and voltage probes, which measure the resulting surface voltage distribution created by current flowing through the sample being measured. In a preferred embodiment, the voltage probes, due to their arrangement and placement in the probe array, measure the voltage at discrete locations on the sample surface for each current flow condition created by applying current through the plurality of current probe pairs. In the preferred embodiment, by sequentially switching between each pair of the predetermined current probe pairs, a plurality of distinct and separate current flow conditions is created with a variation in direction and orientation of the current flow relative to each pair of sensing the voltage probes in the probe array. This variation in direction of current flow and orientation of the flow relative to the voltage probes, enables the detection of discrete perturbations of the surface voltage on a sample by the probe array, where such disruptions are due to the presence of either surface or sub-surface flaws. In addition, the variation in direction and orientation of current flow through the sample enables detection of the location, orientation and size of such flaws due to the distinct changes in surface voltage measured under a variety of current flow orientations.

In one embodiment of a typical probe array configuration, the current probes are located along the perimeter of the array and the voltage probes are located in the area between the current probe perimeter. However, alternative configurations are also anticipated wherein, either the voltage probes are positioned around the perimeter surrounding the current probes, or a combination of current and voltage probes are disposed around the array perimeter. In a preferred embodiment, a switching means provides for redirecting the current flow between successive predetermined pairs of current probes where, due to the location of the individual current probes and current probe pairings within the probe array, the current flows between specific current probe pairs at varying angular directions to the voltage probes arranged within the probe array.

In a preferred embodiment, a data acquisition system provides for measuring either the absolute voltage of the plurality of voltage probes within the probe array or, alternatively, the differential voltage between any pair of voltage probes within the probe array. Voltage measurements are made across the probe array for each current flow condition established by a given current probe pair combination. A recording means provides for either the display or storing of the voltage measurements made for each current flow condition for post-measurement signal processing or analysis.

In a preferred embodiment, a flaw detecting means is used in combination with the data acquisition system which provides a means for automatic detection and reporting of flaws of sample parts to a test operator. In this embodiment, a quantitative method for detecting flaws is provided which relieves the operator of subjective and arbitrary determination of the presence or absence of flaws in a part. In one embodiment, the method comprises the application of a flaw detection algorithm for analysis of measured voltage profiles. In a preferred embodiment, the method may further comprise application of conventional or novel statistical methods to the measured profiles. For example, a statistical distance, a matched filter, a principal component or a multi-layer neural network approach may be utilized. Any other suitable method may be applied providing it meets the requirements of computational simplicity, real time data processing, adaptable sensitivity threshold for detection, and the ability to provide information as to the location, size and orientation of detected flaws.

In general, the invention also relates to a method for detecting flaws in a conductive article which has a volume resistivity of greater than 10,000 microhm-cm or in heterogeneous, multi-phase, or porous samples, or where local microstructural variations in composition or grain size are present. The method additionally provides for determining the location, size and orientation of such flaws within a sample.

In a preferred embodiment, the method comprises contacting a sample with a nonlinear array of probes comprising at least three current probes and three voltage probes. Pairings of the current probes and voltage probes are typically selected prior to initiating current flow or measuring surface voltage on the sample. After selection of the current and voltage probe parings, current is passed through the article by means of each of the predetermined current probe pairs in a sequential manner, one pair at a time. Once current flow is initiated between a given current probe pair, absolute voltage measurements are made by either individual voltage probes or differential voltages are measured by the plurality of preselected voltage probe pairs. The direction and orientation of current flow is then changed by switching the current such that it flows between another pair of current probes. Voltage measurements are repeated for the different current flow condition. This process is repeated until voltage measurements are made under all current flow direction and orientation conditions selected and applied by application of current to the predetermined current probes. In one embodiment, several voltage measurements are made with a given current probe pair flow condition and the measurements are averaged and stored for subsequent analysis. In another embodiment, several voltage profile measurements are taken and the profiles averaged to calculate a baseline surface voltage profile for a specific sample composition and geometry. In a preferred embodiment, the measurements are utilized to construct surface voltage profile mapping of the surface of the part. In this embodiment, disruptions or perturbations in the voltage profile, are used for identifying the location, size and orientation of flaws in the article. In a preferred embodiment, a smart detection algorithm is utilized for automatically detecting flaws and providing information at to their location, size and orientation without the need for subjective operator judgment. In a preferred embodiment, the method may comprise application of conventional or novel statistical methods to the measured profiles, such as a statistical distance, a matched filter, a principal component or a multi-layer neural network approach. Any other suitable method may be applied providing it meets the requirements of computational simplicity, real time data processing, adaptable sensitivity threshold for detection.

The above and other features of the invention, including various novel details of construction and methods, and other advantages, will now be more particularly described with reference to the accompanying drawings and claims. It will be understood to one skilled in the art that the particular apparatus and method embodying the invention are shown by way of illustration and not as a limitation of the invention. The principles and features of the invention may be employed in various and numerous embodiments without departing from the scope of the invention.

BRIEF DESCRIPTION OF THE DRAWINGS

The invention is pointed out with particularity in the appended claims. Other features and benefits of the invention can be more clearly understood with reference to the specification and the accompanying drawings in which:

FIG. 1 shows a typical four-point probe configuration and circuit schematic;

FIGS. 4a–b shows a schematic of the probe array assembly of the present invention;

FIG. 21a–c shows a comparison of differential voltage profile surfaces for flawed and unflawed parts.

FIG. 22 shows a comparison of differential voltage measurements for unflawed and flawed parts with various flaw depths.

FIGS. 23a–b compares differential voltage profile surfaces for a 20 $\mu$m and 200 $\mu$m flaw.

FIGS. 24a–d compares differential voltage profile surfaces for various current flow direction.

FIG. 25a–b compares differential voltage profile surfaces for a moderately flawed and severely flawed part.

DESCRIPTION OF THE PREFERRED EMBODIMENTS

Figure 2:
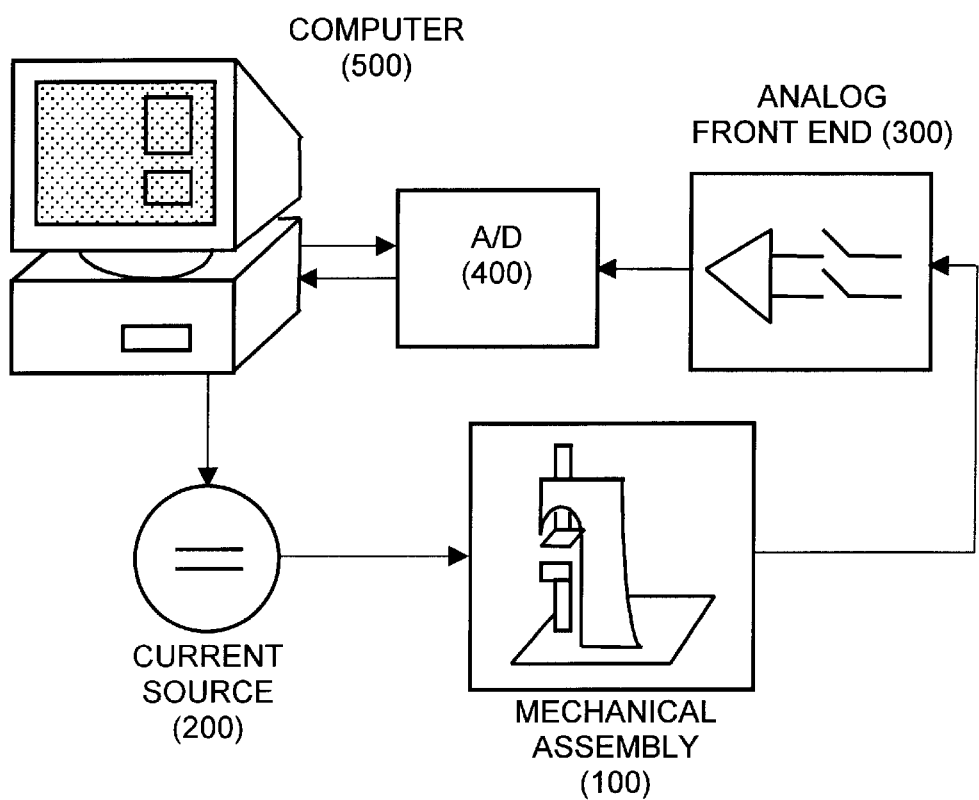
FIG. 2 shows a block diagram for a measurement system of the present invention.

FIG. 2 is a schematic of the impedance measurement system and general components of the present invention. The system comprises a mechanical assembly 100 for contacting the part to be measured with the probe array, a current source 200 for providing current flow to the current probes, a analog front end circuit 300 for redirecting current to the plurality of current probe pairs and switching between the plurality of voltage probes or probe pairs for measurement, filtering and amplification of voltage, an analog to digital converter 400 for digitizing the analog voltage measurements for storage and analysis by a programmed computer 500 acting as a single purpose machine.

Mechanical System

Figure 3:
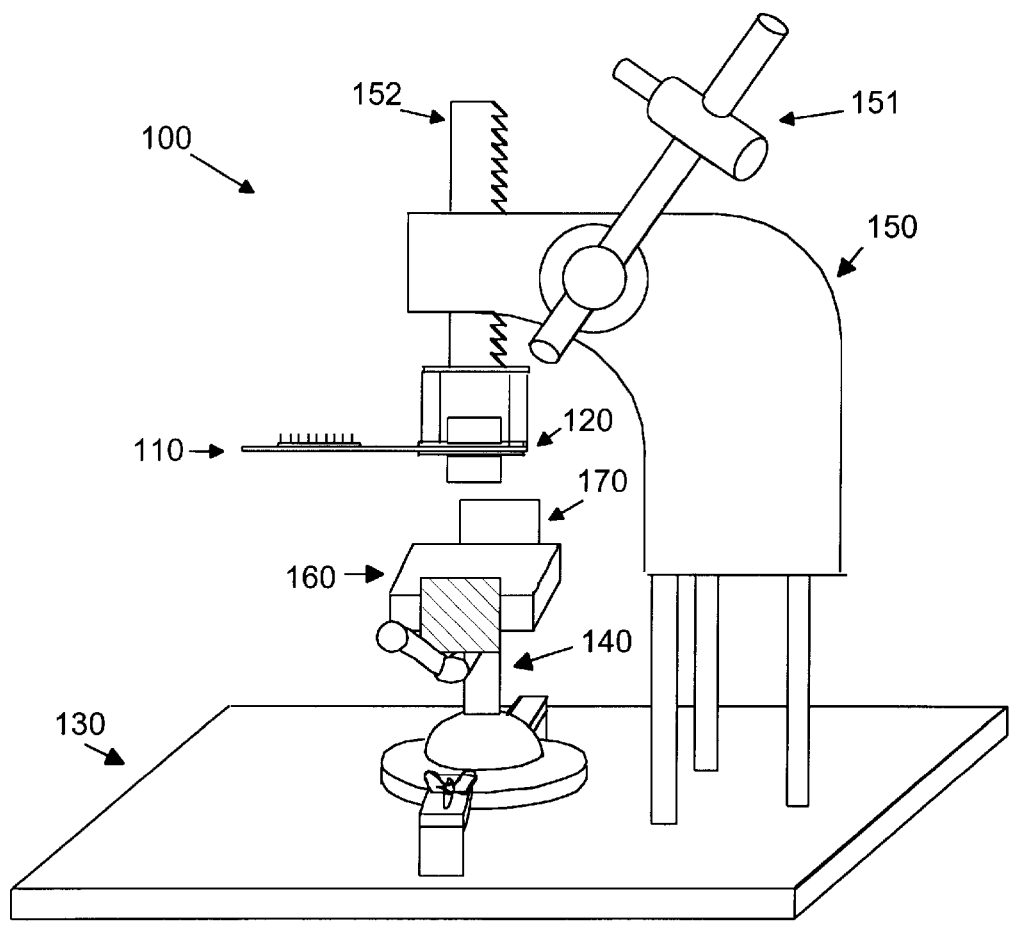
FIG. 3 shows a schematic of a mechanical sub-assembly of the present invention.

A detailed schematic of the mechanical assembly 100 is shown in FIG. 3. The mechanical assembly 100 comprises a base 130 on which is mounted a sample mounting means 140 for securing a sample 160 for measurement. A contacting means 150 comprising and actuator means 151 and a translation means 152 is attached to the base and is designed for bringing a sensor probe array assembly 120 into contact with the sample 160. In one embodiment, the sensor probe array assembly 120 is mounted on an insulated probe assembly board 110 together with various additional components comprising the current source 200 and the analog front end circuit 300. The sensor probe array assembly 120 provides for attachment and deployment of both current probes 121 and voltage probes 122 in a non-linear two or three dimensional probe array.

Figure 4B:
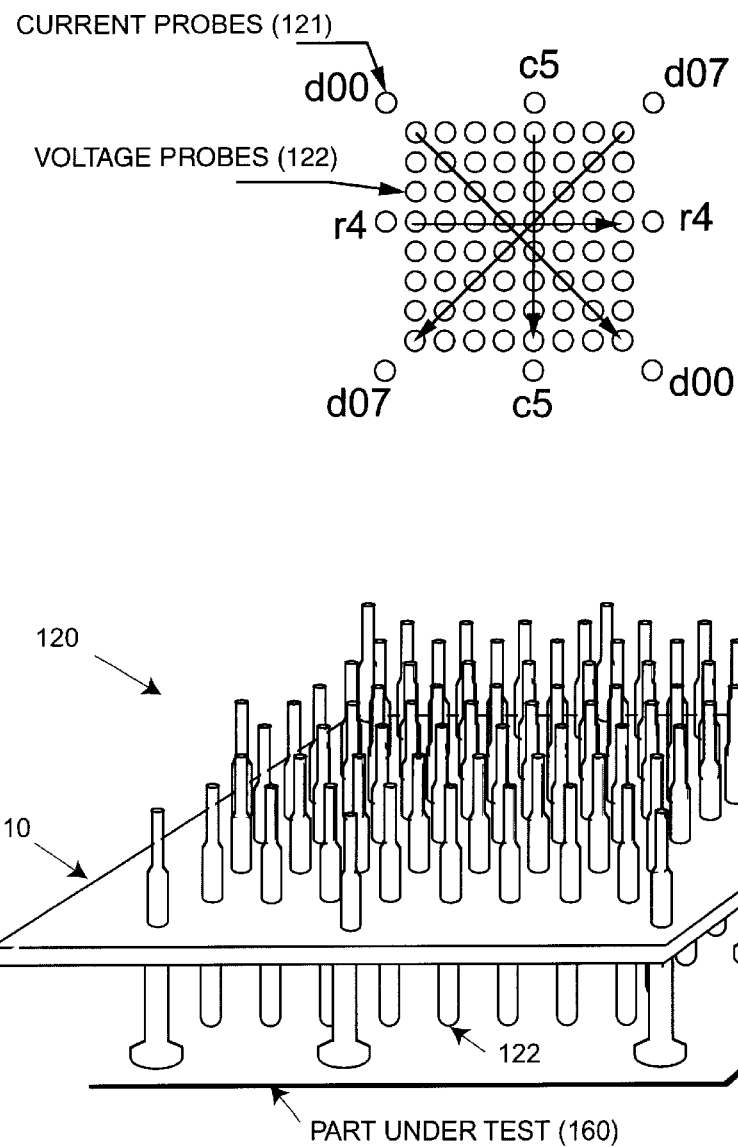

In one embodiment shown in FIG. 3., the contacting means 150 is a Precision Panapress Model 502 arbor press, the translation means 152 is a press ram and the actuator means 151 is a press handle. Other embodiments are anticipated where the contacting means could be a stepper motor or a hydraulic or pneumatic ram actuated my a suitable electrical, hydraulic or pneumatic means. In a preferred embodiment, any conventional force measurement means, such as a strain gauge or transducer, can be integrated with the probe array assembly 120 to control the contact force of the probe array assembly 120 with the sample 160. In one embodiment shown in FIG. 3, the sample mounting means 140 is a Panavise Model 376 vise. Other embodiments are anticipated which provide a similar function. In a preferred embodiment, an insulating fixture 170 can either be incorporated within the sample mounting means or provided separately so as to electrically isolate the sample 160 and provide a means for rapidly and reproducibly mounting samples for production line part measurements. In one embodiment shown in FIG. 3, a fiberglass mold conforming to the sample 160 shape was utilized as an insulating fixture 170. A schematic of the sensor probe array assembly 120 and probe configuration is shown in FIGS. 4a–b.

Electrical System

Figure 5:
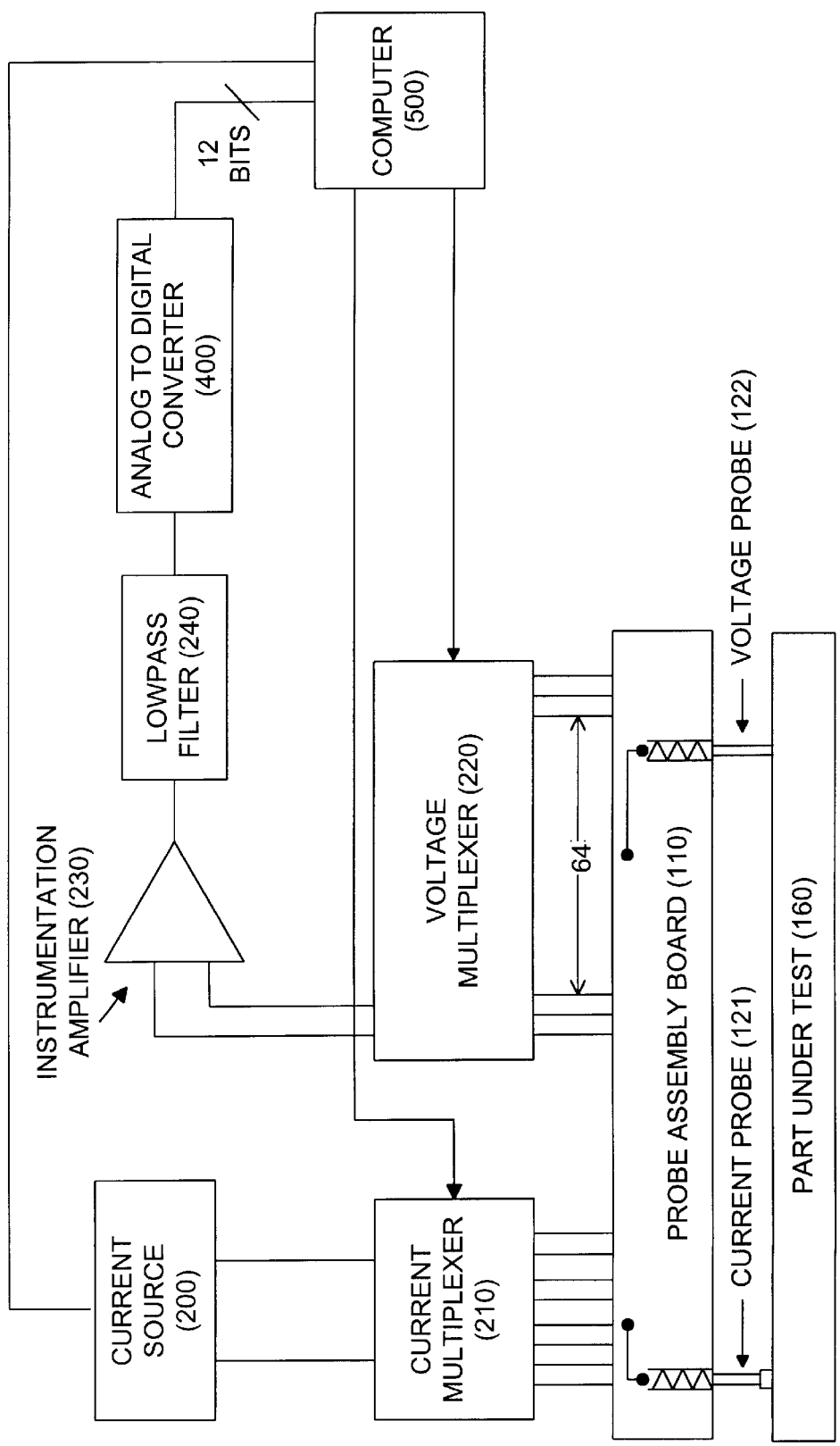
FIG. 5 shows a schematic of the electronics block diagram of the present invention.

In FIG. 5, an electronics block diagram schematic shows how the current source 200, the analog front end circuit 300 components, and the current probes 121 and voltage probes 122 of the sensor probe assembly 120 are arranged and integrated with the probe assembly board 110 and the programmed computer 500. The analog front end circuit 300 which is mounted on the probe assembly board 110 comprises a current switching means, a voltage switching means, a signal amplification means, and a signal filtering means.

In one embodiment, as shown in FIG. 5, the current source 200 is in electrical communication with a current multiplexer 210 which serves as a current switch means. The current multiplexer 210 is in electrical communication with the programmed computer 500 for selection and control of the current flow condition. In one embodiment, the voltage switching means for voltage probe 122 measurements is a voltage multiplexer 220 which is in electrical communication with the voltage probes 122, the instrumentation amplifier 230 and the computer 500.

Referring to FIGS. 4 and 5, in actual operation, a probe assembly 120, comprising eight current probes 121 and sixty-four voltage probes 122, contacts the sample part 160 under test. The test current, provided by a constant current source 120, is applied to the sample part 260 under test through predetermined pairs of eight spring loaded current probes 121. Each pair of current probes are selected by a current multiplexer 210 which is controlled by the programmed computer 500. The different pairs of current probes 121 allow the direction of current flow to be varied over the full range of 360° of the sample part 160 under test while voltage is measured using an array of 64 spring loaded voltage probes 122. While absolute voltage can be measured for each of the 64 voltage probes 122, in a preferred embodiment, differential voltages are measured between each of the voltage probe pairs 122. For differential voltage measurement, two of the 64 voltage probes 122 are selected by a voltage multiplexer 220 which is controlled by the programmed computer 500. The voltage difference between the voltage probes 122 is amplified by an instrumentation amplifier 230. High-frequency noise is attenuated by a lowpass filter 240, which also functions as an anti-aliasing filter prior to input into a 12-bit analog to digital converter 400. The digital representation of the voltage difference is recorded by the programmed computer 500. By sampling the voltage difference between all adjacent pairs of voltage probe pins 122, the voltage distribution on the surface of the part 160 under test can be determined.

An algorithm executed by the programmed computer 500 compares the measured voltage distribution to that of a known good part. Any statistically significant deviation in the measured distribution indicates a flaw, which can be identified in terms of location (the specific voltages showing a deviation), size (number of locations showing a deviation), and orientation (direction of current for which the maximum deviation was measured).

Figure 6:
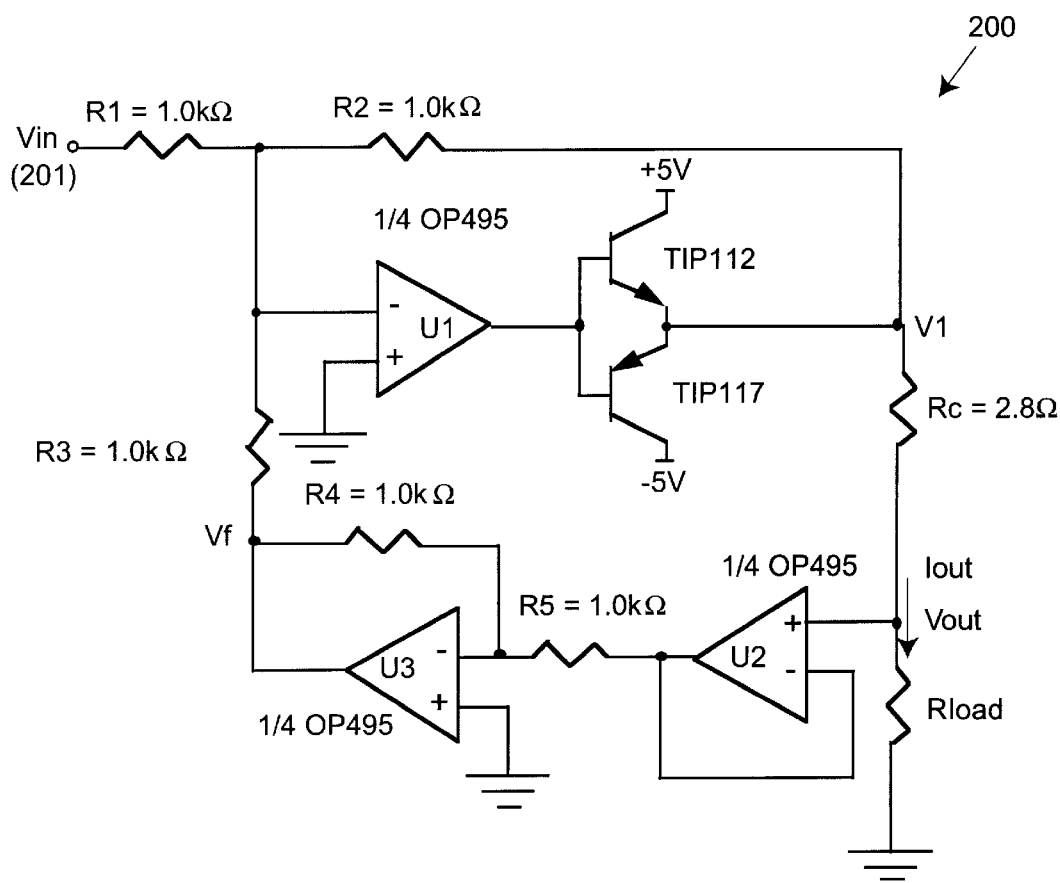
FIG. 6 shows a schematic of the current source circuit of the present invention.

In FIG. 6, a schematic of the current source circuit is provided. The current source 200 is capable of sourcing or sinking a current up to the resistance of the part under test is represented by Rload, which includes the series resistance of the current multiplexer 210 and current probe contacts 121. Since it was desired to use a low supply voltage, the utilization of TIP112 and TIP117 transistors made it necessary to minimize the series resistance in Rload, especially that of the current probe contacts 121. This embodiment required the use a specific probe contact design for different probe tips being used in the current probes 121 and voltage probes 122, which will be discussed below.

The current source is based on a common architecture [see for example J. G. Webster, *Electrical Impedance Tomography*, Adam Hilger Series on Biomedical Engineering, N.Y. 1990] and provides a current that is related to the input voltage by Iout=−Vin/Rc, where Iout is the output current, Vin is the input voltage and Rc is the calibration load resistance. Thus, although a constant current is used, different current levels or a varying current could be used by suitable control of Vin. A current of 0.4 A was used in the test results which are shown in Examples I through VIII. Observed variations in the current were less than 1% over individual tests, and less than 1.5% drift due to aging was observed over several weeks when many tests were performed. This level of performance was achieved even though low cost, imprecise (5% tolerance) components were used in the current source. Maintaining this level of precision was possible using a calibration procedure, implemented automatically by the programmed computer 500, described below.

Figure 7:
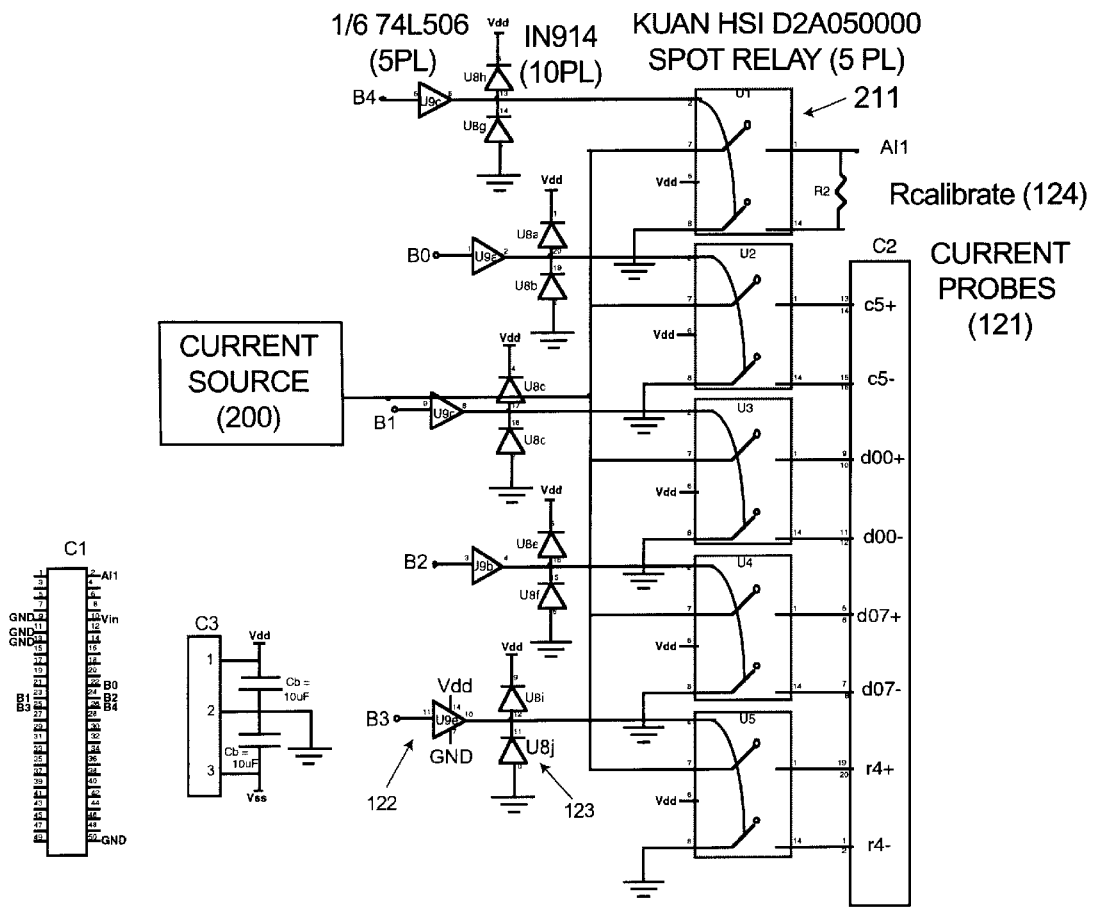
FIG. 7 shows a schematic of a current multiplexer circuit of the present invention.

FIG. 7 shows a schematic of the current multiplexer circuit. Five KUAN HSI D2A050000 SPDT single pole double throw relays 211, selected for their low "on" resistance, are used to switch the current to the current probes 121. The relays 211 are driven by five open collector logic gates 122 controlled by digital signals from the computer 500. Ten 1N914 diodes 123 provide protection for the output of the five logic gates 122 from transients that occur when the relay coils 211 are de-energized. Four of the relays 211 switch current to the current probes 121; the fifth allows access to a calibration resistance Rcalibrate 124. By measuring the voltage drop across this resistance 124, the computer 500 can adjust the input voltage 201 to the current source circuit 200 (FIG. 6) until the desired current is flowing.

Figure 8:
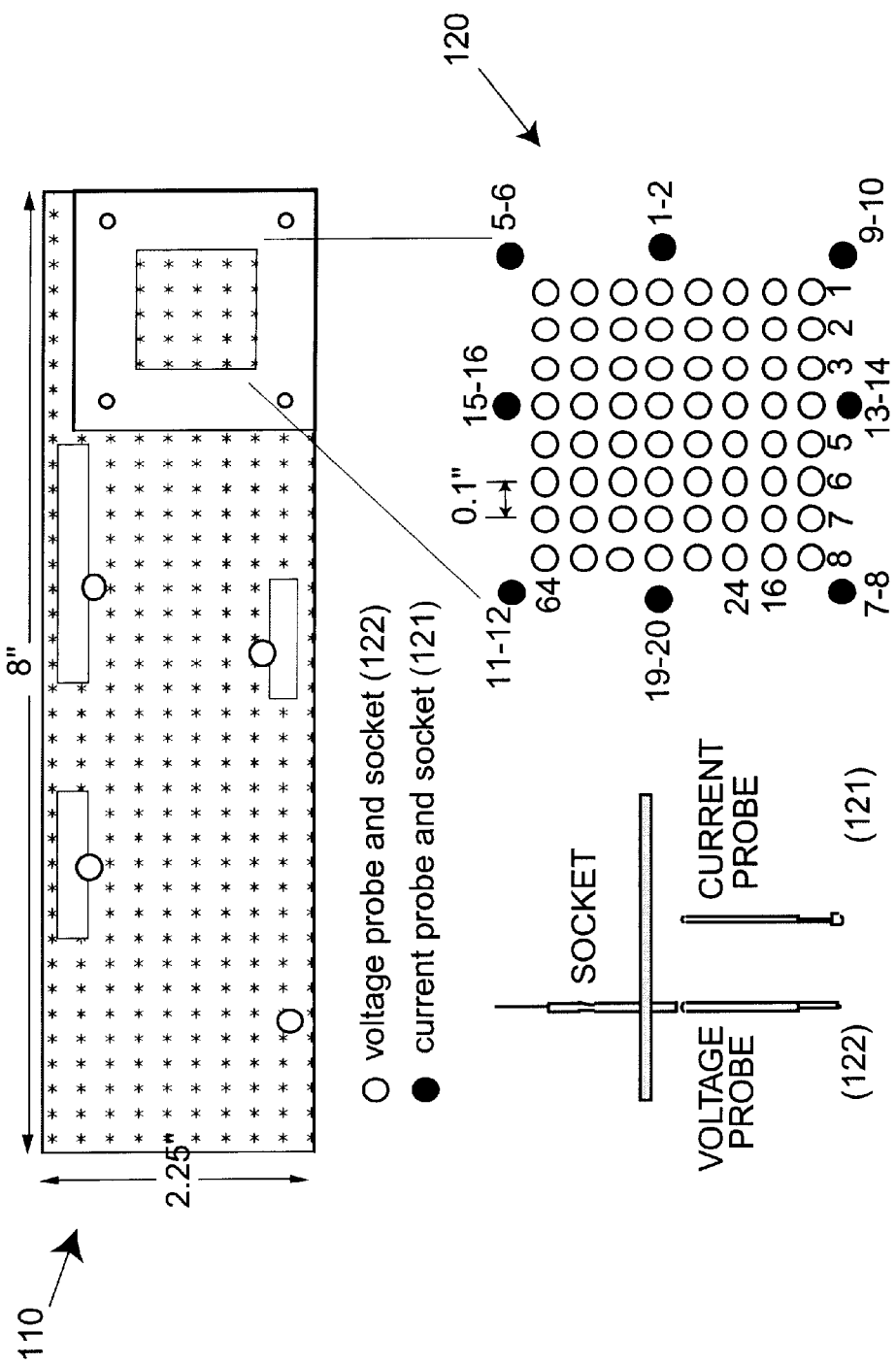
FIG. 8 shows a schematic of a sensor array current and voltage probe configuration of the present invention.
Figure 9:
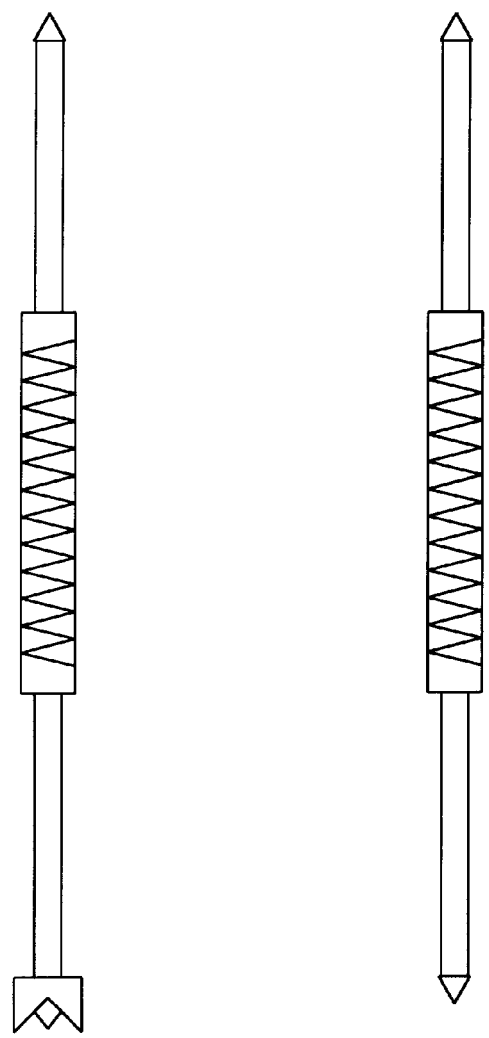
FIGS. 9a–9b show details of a current probe and voltage probe assembly of the current invention.

FIG. 8 shows a schematic of the sensor probe array assembly 120 current probe 121 and voltage probe 122 configuration. The sensor probe assembly 120 contains 64 voltage probes 122 (indicated by open circles) in an 8×8 grid configuration, on 0.1" spacing. The current probes 121 (indicated by closed filled circles) are located on the periphery of the voltage probe 122 array. The current probes 121, as mounted and configured in the sensor probe assembly on the insulated probe assembly board 110, allow the direction of current flow to be varied over the full range of 360°. The probe assembly board also provides mechanical rigidity when the probe assembly is lowered onto the part under test. Both the current probes 121 and voltage probes 122 are spring loaded to ensure good contact with the part 160 under test. FIGS. 9a–9b shows a detail of the current probe 121 and voltage probes 122. The voltage probes 122 have a spherical tip, which provides a small contact area (for good spatial accuracy in voltage measurements) while avoiding damage to the part surface as was observed when "needle-point" pins were used. In one embodiment, Series S probes with a spherical radials tip (Part No. IDI 90F2881) were utilized as voltage probes 122. The small contact area corresponds to a high contact resistance, which does not cause a problem for the voltage probes 122, since no current flows in the voltage measurement probes due to the high input resistance of the voltage measurement circuit as will be discussed below. To keep the contact resistance of the current probes 121 low, probes which have a large contact area were used. In one embodiment, Series S probes with a 90° cup tip (Part No. IDI 90F2877) were utilized as current probes 121. This does not degrade spatial resolution of the voltage distribution in the area covered by the voltage probes 122, as was indicated in an analytical solution of the voltage distribution near the current probe 121. Note that there is no inherent limitation to the use of sixty-four voltage probes 122 or eight current probes 121.

Increasing the number of current probes would allow increased angular resolution in flaw detection. Increasing the number of voltage probes would allow an increase in coverage area and/or improved spatial resolution. There is also no inherent limitation to a grid pattern: for example, a part with a circular geometry might be best tested by a circular array of voltage and current probes. This is possible since the flaw detection algorithm implemented by the computer 500 does not depend on a fixed grid geometry for the probe array.

Figure 10:
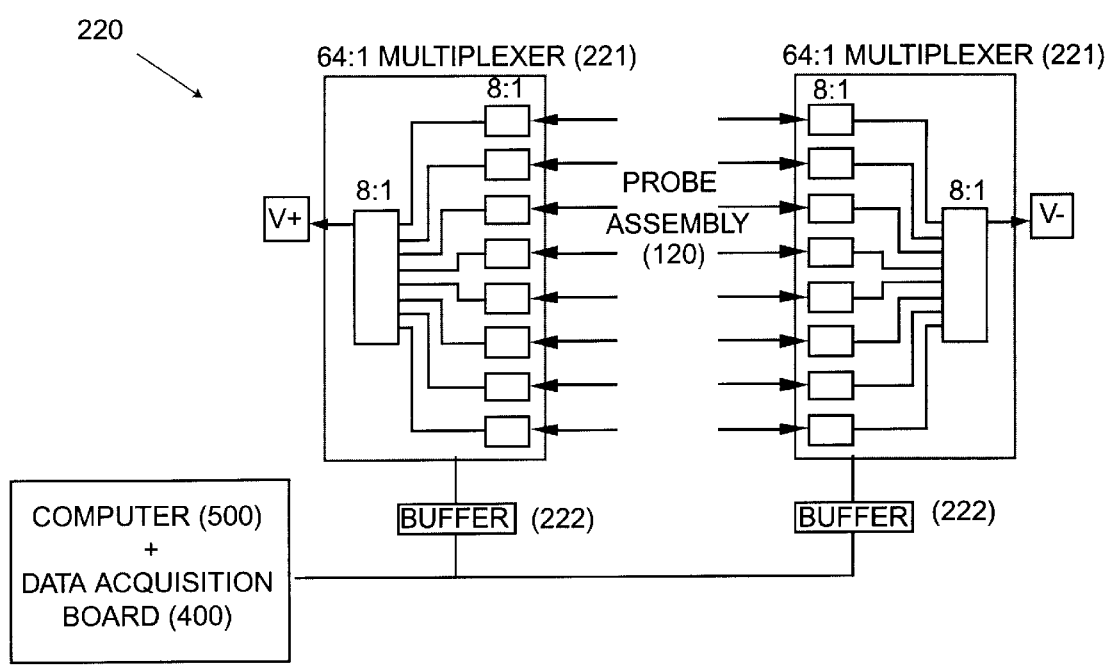
FIG. 10 shows a schematic of a voltage multiplexer circuit of the present invention.
Figure 11:
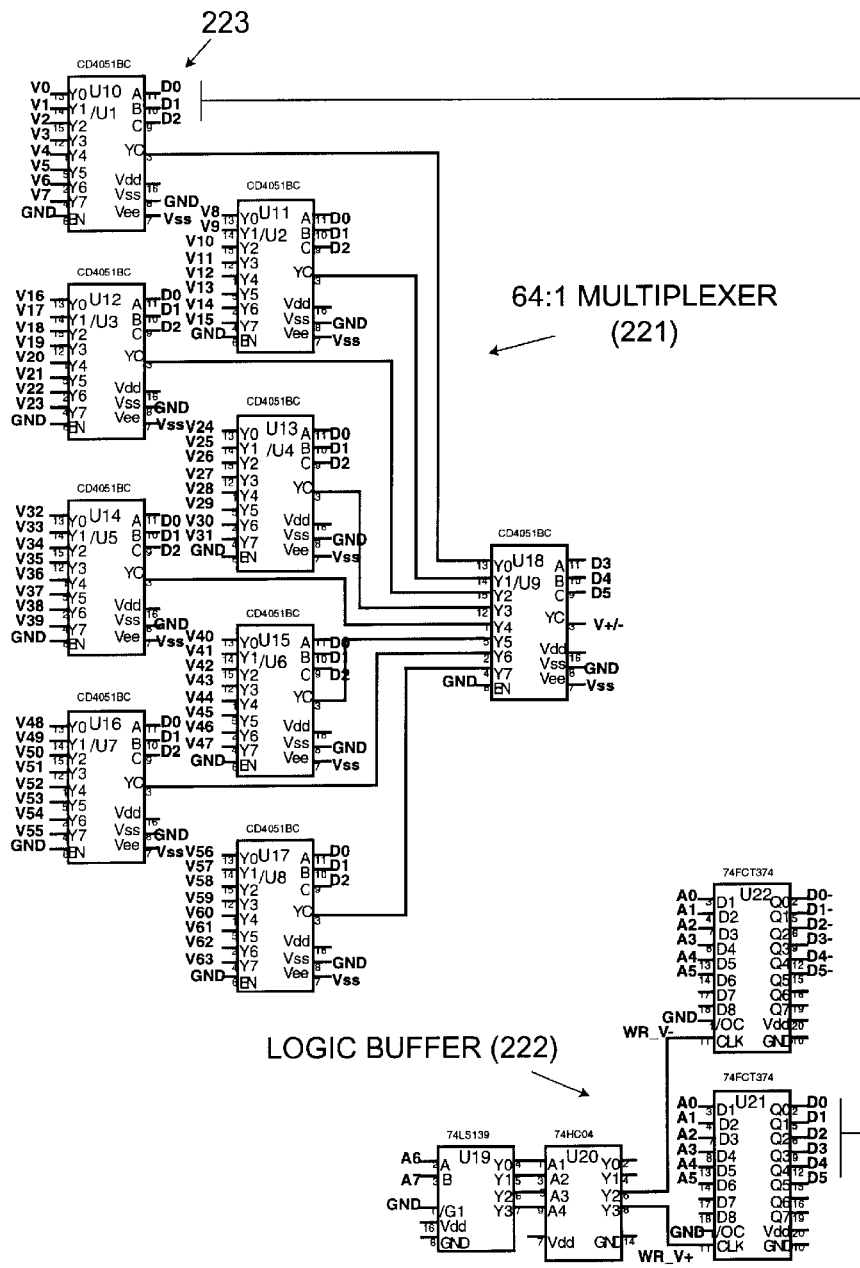
FIG. 11 shows a schematic of a voltage multiplexer and control logic of the present invention.

FIGS. 10 and 11 shows the voltage multiplexer 220 circuit and control logic utilized in one embodiment. The sensor probe array 120 voltage measurement probes 122 are switched with essentially two 64:1 multiplexers 221. A logic buffer 222 passes control signals from a data acquisition board 501 in the programmed computer 500 to the address inputs 223 of each of the multiplexers 221 The nature of the design places no critical requirements on the voltage multiplexer 220; therefore low cost components can be used. The series resistance of the voltage multiplexer 220 is not as critical as that of the current multiplexer 210, since no current flows in the voltage sensing path due to the extremely high input resistance of the instrumentation amplifier 230. The voltage being switched is very small, so linearity is not a concern. Since the signal is processed differentially, common mode noise is canceled.

Figure 12:
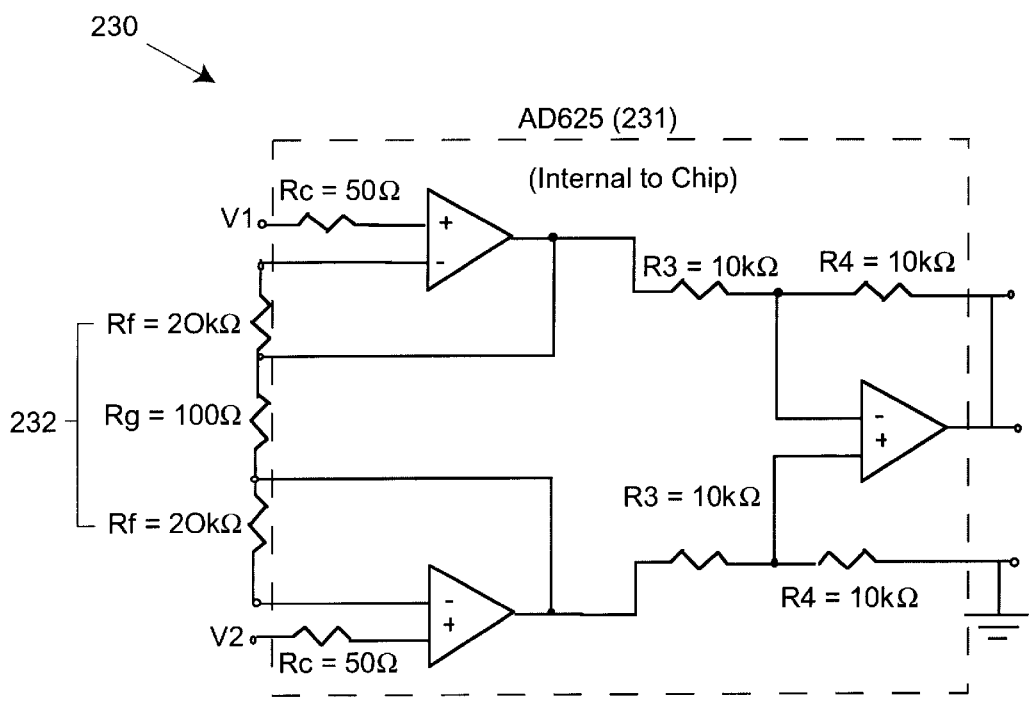
FIG. 12 shows a schematic of an instrumentation amplifier circuit of the present invention.

FIG. 12 shows a schematic of the instrumentation amplifier 230, which was implemented with an Analog Devices AD625 prepackaged integrated circuit 231. With the external gain-setting resistors 232 shown, a gain of 405 V/V was realized. The differential configuration rejects any common mode noise sources, and provides at the output a scaled version of the actual differential voltage present at the voltage measurement probes 122 selected by the voltage multiplexer 220. The input resistance of the AD625 is preferably a value greater than 1 G ohm.

Figure 13:
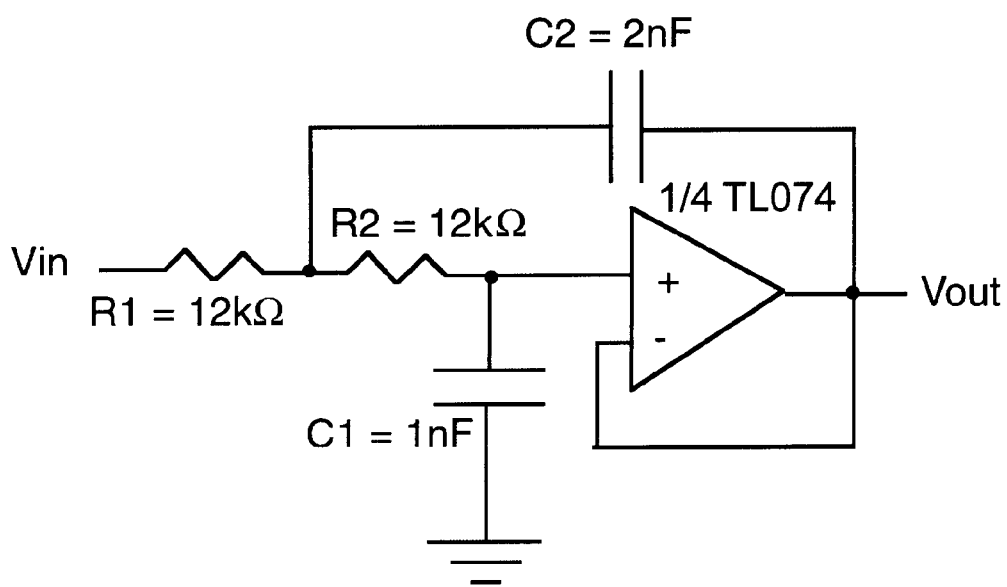
FIG. 13 shows a schematic of a low pass filter circuit of the present invention.

FIG. 13 shows a schematic of the lowpass filter circuit 240 used to remove high frequency noise prior to analog-to-digital (A/D) conversion by the A/D converter 400. This filter circuit 240 is of a conventional design and is known is a second-order Butterworth filter (maximally flat frequency response, with moderate overshoot in the time domain), with a measured 3-dB frequency of 9.12 kHz. The selected cutoff frequency limits the speed with which the voltage multiplexer 220 can be switched, since the filter 240 output must settle to the new voltage value before the analog-to-digital converter 400 can be triggered.

Figure 14:
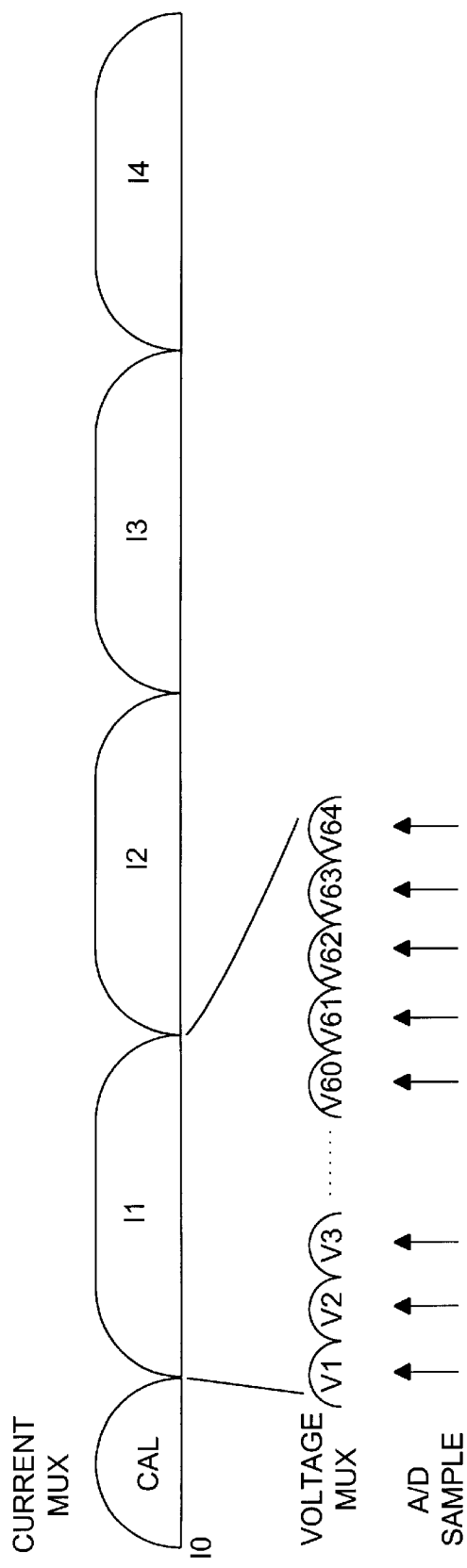
FIG. 14 shows a schematic of a system timing method of the present invention.

The analog-to-digital (A/D) converter 400 utilized was of 12 bit resolution, and was integrated with the data acquisition board 501 installed in the computer 500 used. A LabVIEW DAQ board from National Instruments was utilized in one embodiment for the measurements of Examples I–VIII. The timing of the current and voltage switching in relation to the A/D conversion process is shown in FIG. 14. After initial calibration period I0, the total measurement time is divided in to four equal periods, I1 through I4, one for each direction of current flow. Within each of these four periods, there are 64 subdivisions for each voltage multiplexer 220 measurement. The actual voltage measurements made and the order of voltage probes 122 accessed by the voltage multiplexer 220 depend on the current flow conditions. Voltage differences are measured along the direction of current flow since this orientation provides the largest signal. A sampling rate of 4000 samples/sec was typically utilized for measurements reported in Examples I–VIII. The A/D conversion is triggered at the end of each voltage multiplexing time interval I1–I4, to give the output of the lowpass filter 240 sufficient time to settle to its correct voltage value. All of the timing is under control of digital signals provided by the computer. It can be seen that the flexibility provided by digital control will easily accommodate enhancements of the basic method, for example, increasing the number of voltage and/or current probes.

Computer Control and Data Acquisition

A commercially available laboratory data acquisition software environment (LabVIEW from National Instruments) was utilized for interfacing the measurement system with a MacIntosh computer. Experimental sampling parameters, instrument settings and data acquisition variables were entered and measurements were initiated and controlled by the programming features provided within the LabVIEW graphical user interface environment.

Figure 15:
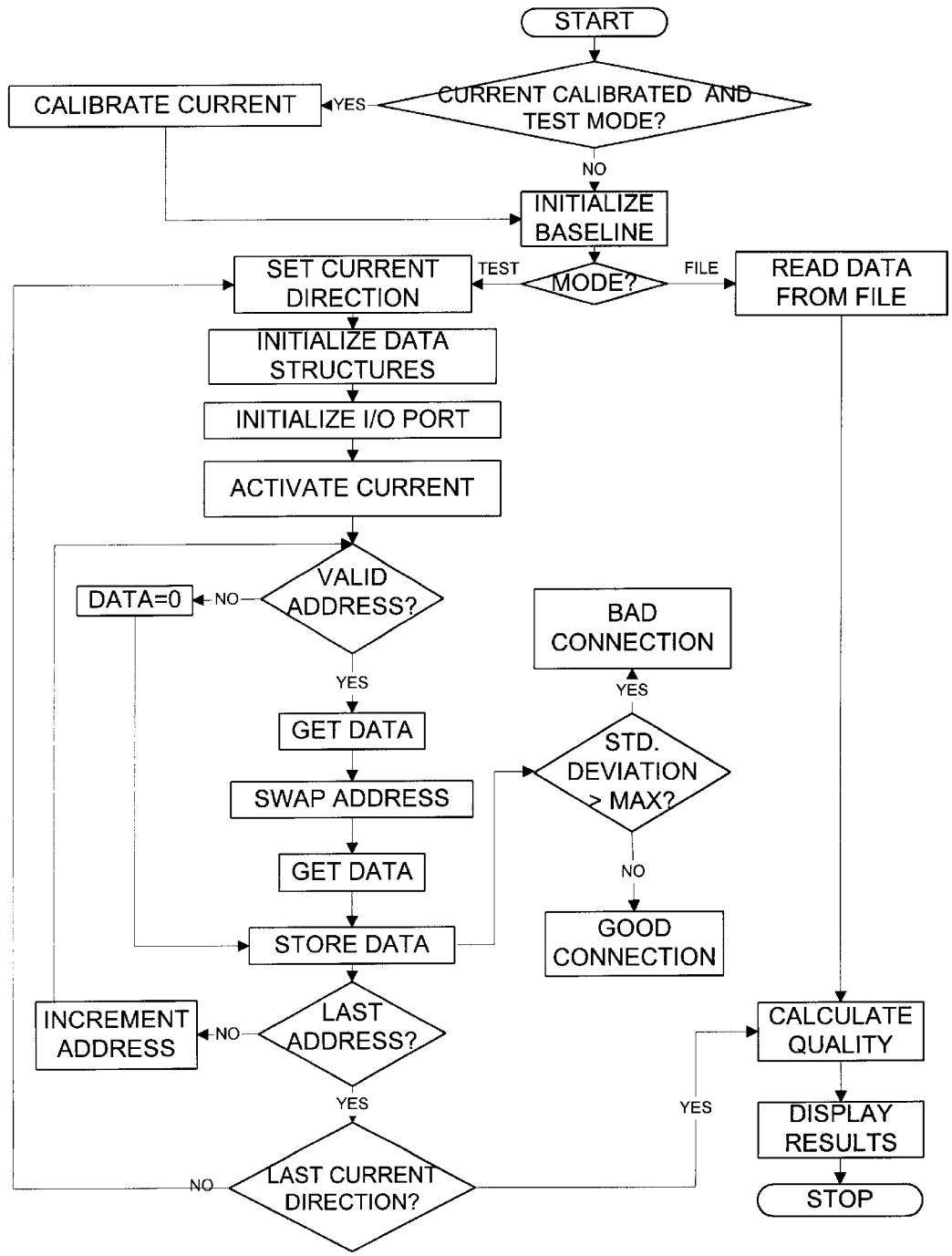
FIG. 15 shows a sample test program flowchart for a typical experimental measurement.

FIG. 15 shows a sample test program flowchart for a typical measurement run. The program initially calibrates the current source and initializes the baseline from stored baseline data files for the specific sample. For a test run, the data storage arrays are initialized and a predetermined current probe pair is activated. Once current flow is initiated and directed to a selected current probe pair by the current multiplexer, the program cycles through each of up to sixty-four possible voltage probe pair measurements in the direction of current flow. Preferred probe pair addresses are selected according the direction of current flow. Both forward and backward data are taken to eliminate random offsets that may occur in the circuitry. By subtracting the forward from the backward voltage, the variance in the readings is significantly reduced. The data acquisition algorithm provides for error checking, for example invalid edge addresses or otherwise undesirable probe addresses where there is evidence of poor electrical contact with the sample. Once measurements are completed for a particular current flow direction, the data is stored and the program goes on to the next current direction. Once data is collected and stored for all directions, the data is passed to a detection algorithm discussed below.

Figure 16:
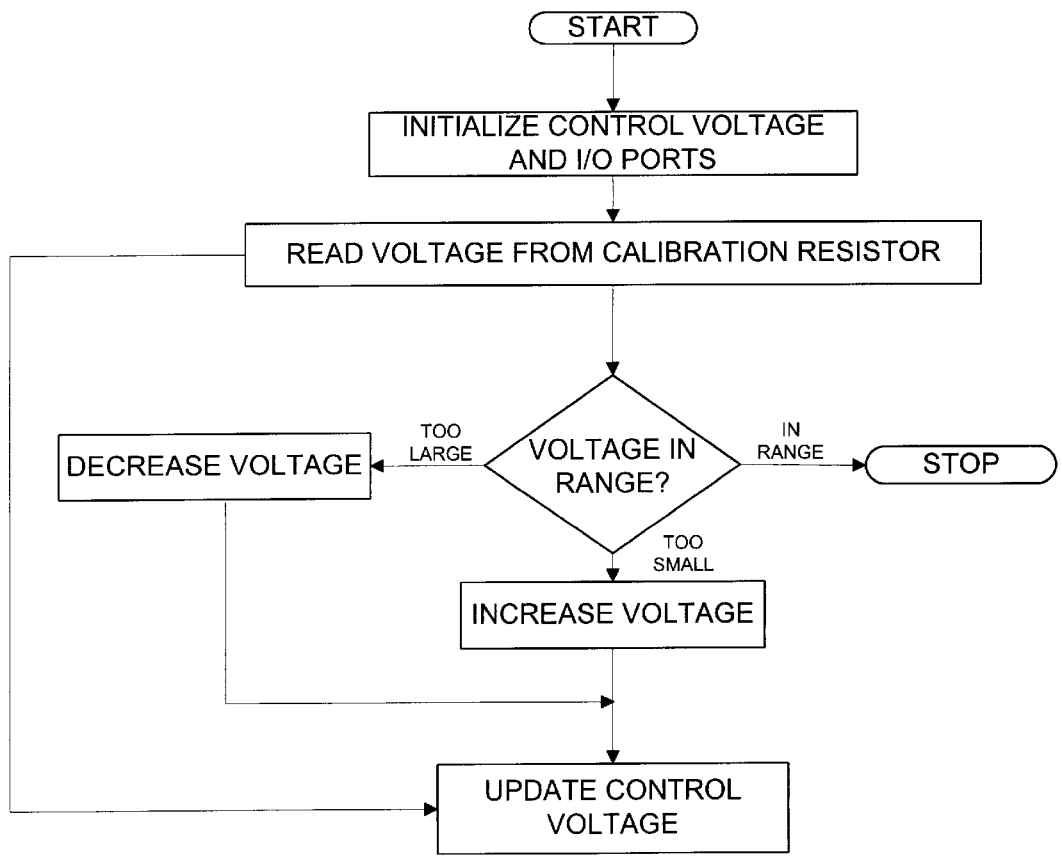
FIG. 16 shows a current calibration program flowchart for a typical current source calibration.
Figure 17:
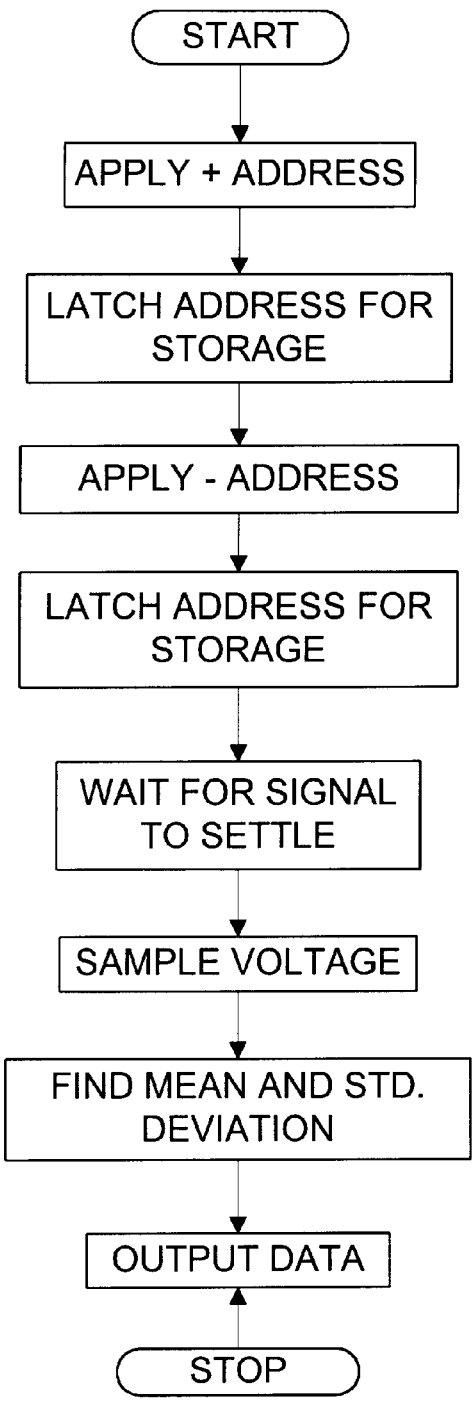
FIG. 17 shows a sample data acquisition program flowchart for a typical experimental measurement.

All input/output functions used to communicate with the LabView DAQ data acquisition board ports are performed using advanced functions built-in to the LabVIEW program environment. However, a conventional algorithm for current calibration function and acquiring data measurements were written using the LabVIEW programming features. FIG. 16 shows a typical current calibration program flow chart for conventional calibration of the current source. Basically, the current flow is directed through a resistor of known value and the resulting voltage compared to acceptable ranges and the control voltage is adjusted as necessary. FIG. 17 shows a typical data acquisition program for selecting voltage probe addresses and taking measurements. The program returns the mean voltage and standard deviation of sampled values to the main test program of FIG. 15.

Once all data has been acquired by the data acquisition board 501, the LabVIEW program environment may be used for statistically processing the acquired data, to display measured voltage or differential voltage surface distributions for the sample, and for implementing a detection algorithm on the voltage distributions to determine the presence of flaws, if any, and their position, size, and orientation.

Detection Algorithm

Figure 18:
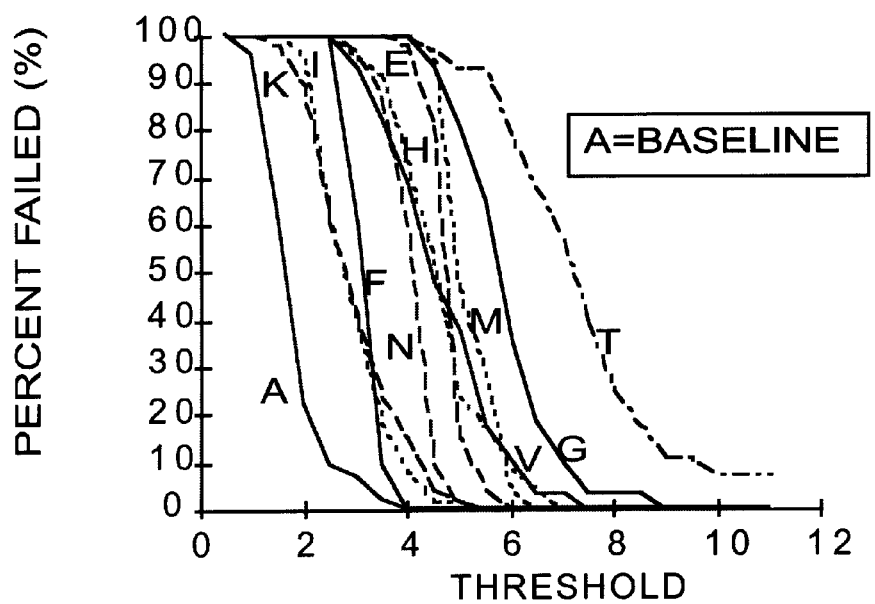
FIG. 18 shows the results of a flaw detection algorithm applying the statistical distance method.

Conventional statistical methods may be applied to the voltage measurement data to generate a detection algorithm for detecting flaws and determining their location, size and orientation. Known statistical methods may be applied which are available in the statistical literature [see for example G. E. P. Box, W. G. Hunter and J. S. Hunter, *Statistics for Experimenters, An Introduction to Design, Data Analysis, and Model Building*, J. Wiley & Sons, N.Y., N.Y. 1991]. The statistical distance method was found to be particularly useful for generating a detection algorithm for application to the measurements of Examples I–VIII. With this method, a conventional statistical distribution model was utilized to find the probability of a flaw given a known mean and standard deviation. The only assumption was that the baseline parameters be normal at each spatial location. Since each baseline measurement for flaw-free samples has an identical independent distribution from part to part, the sum of voltage measurements for baseline parts is used as a reference voltage distribution. A normalized parameter, referred to as statistical distance is expressed as $(y-\eta)/\sigma$ where $\eta$ is the sampled mean of the baseline and $\sigma$ is the sampled standard deviation of the baseline and y is the measured voltage value for that spatial location. This value is used with a statistical look up table to calculate the probability that the measure value for y occurs in an acceptable sample part. For the purpose of screening test samples for flaws, a confidence interval can be selected to match criteria for acceptable parts. From the confidence interval, an acceptable threshold for the statistical distance is selected. Since this is done for each measurement, the threshold must be set to ensure a valid confidence interval over all spatial locations measured on the part surface. The statistical distance can be easily calculated for each measurement location. The redundant measurements of voltage made at each array location with varying current flow directions allow greater certainty in applying a given threshold to the data since criteria can be established for the statistical distances calculated for all of the current directions. The application of the method to the redundant measurements acquired at each probe location from varying current flow directions provides for the detection of the location and orientation of flaws which are detected. The method was easily applied in LabVIEW or in C Programming Language. FIG. 18 shows the results of application of this method to approximately 500 component parts made according to the method described in Example I. The percent of parts which failed or were found unacceptable due to flaws is determined by establishing an acceptance threshold for the manufactured part. In FIG. 18, for instance, if a threshold of 4 is adopted, all the flaw-free baseline parts of batch a would pass inspection while the majority of batches made with intentional flaw would fail. Thus, the method provides for an automatic detection and reporting mechanism for production line parts. The method provides a quantitative criteria for detecting flaws and which relieves the operator of subjective and arbitrary determinations of the presence or absence of flaws in a part. Furthermore, application of the method to measurements made with varying current flow directions enables detecting both the location and orientation of observed flaws. Additional embodiments, using other statistical methods, such as a matched filter method, a principal component method or a multi-layer neural network approach may also be adopted to generate equally useful detection algorithms.

The following Examples illustrate a variety of measurements that demonstrate the advantages and utility of the present invention.

EXAMPLE I

For determining the differential voltage profile of a defect free part, the method of the present invention was used to map the differential voltages over the surface of an engine weight component used as a vibration stabilizer in an automotive application. The part was made from a conventional ferrous alloy composition. A powder press formulation was prepared in a conventional 8 qt. capacity Patterson-Kelly V-Blender mixer from the following conventional formulation: 2.5% Copper (Alcan 165), 1% Graphite (S.W. 1651), 0.7% Acra Wax "C", 0.25% Zinc Stearate, 0.5% MNS (Elkem), and the balance Iron 500 MA (Kobelco) powder. The part was compacted by conventional powder metal pressing methods to a green density of 6.7 g/cm$^3$. Both flaw-free baseline components as well as intentionally flawed components were made for test purposes. A stepped core rod insert was used in the molding process to introduce cracks in pressed parts.

Figure 19:
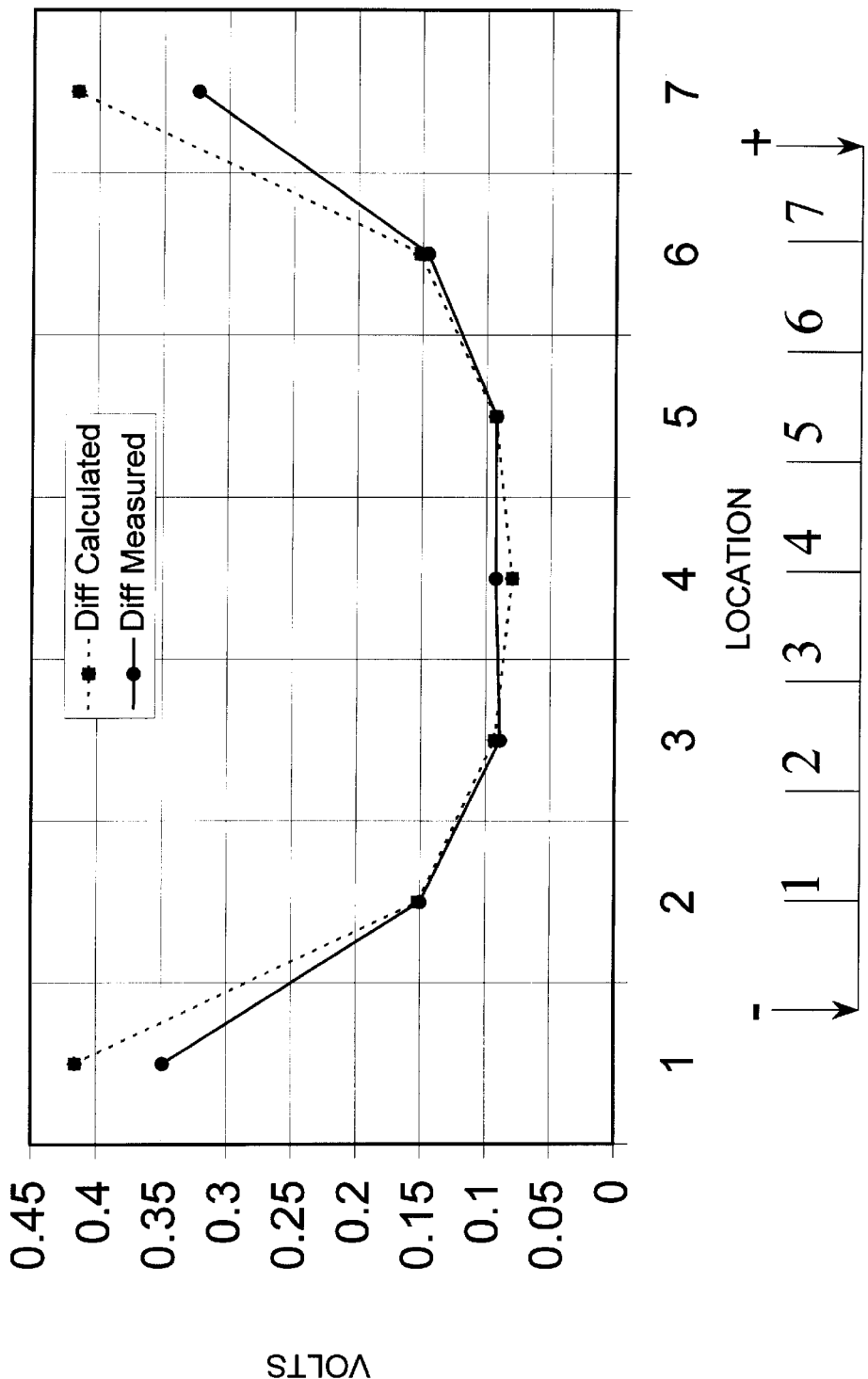
FIG. 19 shows a typical parabolic differential voltage measurement profile for an unflawed part.

The surface voltage profiles of the baseline and flawed components were measured by the apparatus and method of the present invention. The measured results were compared with finite element numerical predictions and are shown in FIG. 19 where the differential voltage measurements for a flaw free part are presented for one row of probe measurements taken with and 8×8 probe array. These measurements were taken between a pair of current electrodes and demonstrate the presence of a parabolic-shaped profile over the surface of a flaw free baseline sample. The steep voltage gradient at locations 1 and 7 is due to the proximity of the to these locations.

EXAMPLE II

Figure 20:
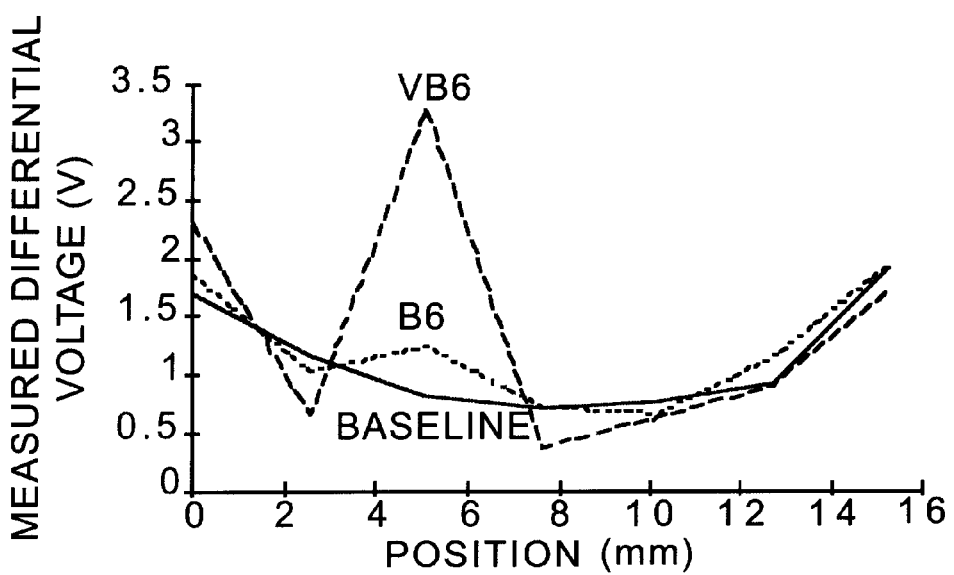
FIG. 20 shows a comparison of typical differential voltage measurements for a flawed and unflawed part.

For determining the differential voltage profile of a flawed part, the method of the present invention was used to map the differential voltages over the surface of three components manufactured according to the method of Example I. A baseline flaw-free component, a moderately flawed component and a severely flawed component were selected for these measurements. Sample b6 was a production part having a modest flaw and sample vb6 was a production part having a severe flaw. The results are shown in FIG. 20 where the differential voltage measurements are presented for one row of probe measurements taken with and 8×8 probe array. In the figure, the differential voltage measurements for the b6 and vb6 samples are compared to a flaw-free sample. As shown is this figure, the normal parabolic differential voltage profile, which is observed in the flaw-free part, is disrupted by the presence of flaws found in both the b6 and vb6 parts as evidenced by the peak in voltage observed near the 5 mm position. This figure also indicates that the flaw occurs in both production parts at essentially the same location, thus indicating, by a non-destructive test, either a problem with the part design or the production process which introduced the flaw.

EXAMPLE III

For mapping the differential voltage profile of production parts, the method of the present invention was used for detecting flaws in components manufactured according to the method of Example I. The differential voltage measurements for the entire 8×8 probe array are shown in FIG. 21a–c where the differential potential surface if mapped for a flaw-free part in FIG. 21a, a moderately flawed part in FIG. 22b, and a severely flawed part in FIG. 21c.

A post-measurement metalographic analysis of the moderately flawed part indicated the presence of a defect at a depth between 5 to 20 mm, between 10 to 30 $\mu$m in width and less than 10 mm in length. The presence of this defect produced a differential voltage peak of 1.4 to 1.8 times the differential voltage measured on the defect-free part.

A post-measurement analysis of the severely flawed part indicated the presence of a defect running through the sample and 70 to 150 $\mu$m in width. The presence of this defect produced a differential voltage peak of 3.5 to 4.5 times the differential voltage measured on the defect-free part. An additional advantage of the method of the present invention is shown in FIGS. 21b–c where mapping the differential potential over the surface of the part, provides information as to location and orientation of the flaw in the part. The location of the flaw is indicated by the location of the peak in the measure profile. The orientation of the flaw is aligned with the ridge in the peak differential voltage.

EXAMPLE IV

For determining the size detection limit of the inventive method, artificial flaws were introduced into pressed, unsintered stainless steel alloy powder metal samples, 2⅝ in×2⅝ in by 1½, by placing 20 mm×2.5 mm×400 $\mu$m PVC strips within loose powder compacts at two locations and pressing the powder to a nominal density of approximately 6.7 g/cm³. The PVC strips were compressed to approximately 200 $\mu$m by the pressing operation. In one location, representing surface flaws, the strips were placed with their edge parallel to the sample surfaces. In a second location, representing bulk flaws, strips were place with 5 mm below the sample surface. The compaction pressure formed plate defects 200 $\mu$m in thickness. For comparison, baseline samples were prepared with no defects.

The voltage profile of each sample was measured and the results are shown in FIG. 22 for shows the voltage profile for a 25 mm×2.5 mm×200 $\mu$m flaw introduced at various depths ranging from 1 mm to 5 mm below the sample surface. As shown by FIG. 22, the method of the present invention could detect the presence of a 200 $\mu$m flaw below the surface at depths ranging from 1 to 5 mm.

EXAMPLE V

For determining the size detection limit of the inventive method, artificial flaws were introduced into pressed, unsintered conventional stainless steel alloy powder metal samples by placing 20 mm×2.5 mm×37.5 to 400 $\mu$m thick PVC strips within loose powder compacts. Samples were prepared as in Example III. In order to represent surface flaws, the strips were placed with their edge parallel to the sample surfaces. Upon compaction of the loose compacts, plate defects were formed ranging in thickness between 20 $\mu$m to 200 $\mu$m. For comparison, baseline samples were prepared with no defects.

The voltage profile of these samples were measured by the method of the present invention. FIGS. 23a–b shows a map of the surface voltage profile for a 25 mm×2.5 mm×20 $\mu$m flaw introduced at the sample surface and FIG. 23b shows the corresponding map for the surface voltage profile for a 25 mm×2.5 mm×200 $\mu$m flaw introduced at the sample surface.

As shown by FIG. 23a, the method of the present invention allows detection of flaws 20 $\mu$m in size in unsintered stainless steel alloys.

EXAMPLE VI

To demonstrate the capability of the method of the present invention for determining the orientation of flaws in a sample, differential voltage profiles were measured on a flawed production part produced by the method of Example I using various current flow orientations. The profile was generated by taking differential voltage measurements over the entire 8×8 array for the four current flow directions shown in FIG. 24. The results are shown in FIG. 24a–d where the differential profile is shown together with the location of the current probes for each of the four current flow configurations. The orientation of the flaw is shown by the dark line on the part drawing. As shown by the results for current flowing in the c5, d00 and d07 directions, when the probe current flows around the flaw, a disruption in the parabolic profile is created and a peak in the differential voltage is observed. However, as shown in FIG. 24d, when the probe current flows parallel to the orientation of the flaw, there is minimal disruption of the parabolic saddle profile formed between the current probes. Thus, by measuring the differential voltage profile resulting from current flow at various angular orientations across a sample, the orientation of a defect may be determined.

EXAMPLE VII

To demonstrate the capability of the present invention to detect flaws in production parts, differential voltage profiles were measured on 14 flawed production samples made by the method of Example I and voltage measurements were compared with flaw-free baseline parts. FIGS. 25a–b shows typical differential voltage profiles measured on a moderately flawed and severely flawed sample. After the voltage profiles were measured on these samples, the samples were subjected to metallographic analysis to confirm the presence and location of flaws detected by the method of the present invention. The results of this experiment are shown in Table 1 where location and size of sample flaws at the location of each voltage probe in linear array of eight probes are provided together with the differential voltage measured at the probe array position for the flawed part and flaw-free baseline sample. The ratio of differential voltages for the flawed and flaw-free sample are also shown. The normal parabolic voltage profile of a flaw-free part is indicated a voltage ratio of 1.0. The presence of a flaw in the part will disrupt the normal parabolic voltage profile and lead to a voltage ratio greater than 1.0. As observed by the results in Table 1, the method of the present invention is capable of detecting flaws non-destructively, as confirmed by subsequent metallographic determination of the size and location of the flaws.

Having described the preferred embodiments of the invention, it will now become apparent to one of skill in the art that other embodiments incorporating the concepts may be used without materially departing from the teachings and advantages of this invention. Therefore, it is not intended to limit the invention to the disclosed embodiments but rather the invention should be limited by the spirit and scope of the following claims. In the claims which follow, means-plus-function clauses are intended to include both structures described herein as performing the recited function as well as not only the structural equivalents to the described structures but also the equivalent structures.

TABLE 1

| position | mater. depth (mm) | flaw depth (mm) | ave. width (mm) | dist. to top (mm) | dist. to bot (mm) | Flaw volt. (V) | Baseline volt. (V) | Flaw/baseline ratio (V/V) |
|---|---|---|---|---|---|---|---|---|
| b1 | | | | | | | | |
| 1 | 6 | 0 | 30 | | 0 | 1.01 | 0.760 | 1.328 |
| 2 | 6.5 | 2 | 30 | 4.5 | 0 | 0.993 | 0.763 | 1.300 |
| 3 | 7 | 3 | 0 | 4 | 0 | 0.848 | 0.761 | 1.113 |
| 4 | 10 | 6 | 0 | 4 | 0 | 0.887 | 0.822 | 1.079 |
| 5 | 30 | 20 | 0 | 4 | 6 | 0.707 | 0.739 | 0.956 |
| 6 | 30 | 18 | 0 | 6 | 6 | 0.673 | 0.713 | 0.943 |
| 7 | 30 | 14 | 0 | 7 | 9 | 0.619 | 0.693 | 0.892 |
| 8 | 30 | 5 | 0 | 13 | 12 | 0.542 | 0.634 | 0.854 |
| b2 | | | | | | | | |
| 1 | 6 | 6 | 30 | 0 | 0 | 0.924 | 0.760 | 1.21 |
| 2 | 6.5 | 4.5 | 10 | 2 | 0 | 0.899 | 0.763 | 1.177 |
| 3 | 7 | 4 | 0 | 3 | 0 | 0.923 | 0.761 | 1.212 |
| 4 | 10 | 7 | 0 | 3 | 0 | 0.949 | 0.82 | 1.154 |
| 5 | 30 | 21 | 0 | 3 | 6 | 0.751 | 0.73 | 1.016 |
| 6 | 30 | 18 | 0 | 4 | 8 | 0.708 | 0.713 | 0.992 |
| 7 | 30 | 13 | 0 | 6 | 11 | 0.554 | 0.693 | 0.799 |
| 8 | 30 | 0 | 0 | | | 0.58 | 0.634 | 0.913 |
| b3 | | | | | | | | |
| 1 | 6 | 6 | | 0 | 0 | 1.12 | 0.760 | 1.473 |
| 2 | 6.5 | 6.5 | | 0 | 0 | 1 | 0.763 | 1.310 |
| 3 | 7 | 7 | | 0 | 0 | 0.952 | 0.761 | 1.250 |
| 4 | 10 | 6 | | 0 | 4 | 0.82 | 0.822 | 0.997 |
| 5 | 30 | 0 | | | | 0.688 | 0.739 | 0.930 |
| 6 | 30 | 0 | | | | 0.655 | 0.713 | 0.918 |
| 7 | 30 | 0 | | | | 0.581 | 0.693 | 0.838 |
| 8 | 30 | 0 | | | | 0.49 | 0.634 | 0.772 |
| b4 | | | | | | | | |
| 1 | 6 | 5 | 25 | 1 | 0 | 1.03 | 0.760 | 1.354 |
| 2 | 6.5 | 5.5 | 10 | 1 | 0 | 1.02 | 0.763 | 1.336 |
| 3 | 7 | 6 | 10 | 1 | 0 | 0.97 | 0.761 | 1.274 |
| 4 | 10 | 7 | 0 | 3 | 0 | 0.86 | 0.822 | 1.046 |
| 5 | 30 | 22 | 0 | 4 | 4 | 0.737 | 0.739 | 0.997 |
| 6 | 30 | 21 | 0 | 5 | 4 | 0.695 | 0.713 | 0.974 |
| 7 | 30 | 19 | 0 | 7 | 4 | 0.596 | 0.693 | 0.859 |
| 8 | 30 | 0 | 0 | | | 0.532 | 0.634 | 0.838 |
| b6 | | | | | | | | |
| 1 | 6 | 6 | 20 | 0 | 0 | 1.31 | 0.760 | 1.723 |
| 2 | 6.5 | 6.5 | 20 | 0 | 0 | 1.26 | 0.763 | 1.650 |
| 3 | 7 | 7 | 20 | 0 | 0 | 1.32 | 0.761 | 1.733 |
| 4 | 10 | 10 | 20 | 0 | 0 | 1.25 | 0.822 | 1.520 |
| 5 | 30 | 26 | 10 | 0 | 4 | 0.979 | 0.739 | 1.324 |
| 6 | 30 | 24 | 0 | 2 | 4 | 0.822 | 0.713 | 1.152 |
| 7 | 30 | 20 | 0 | 4 | 6 | 0.674 | 0.6933 | 0.972 |
| 8 | 30 | 15 | 0 | 9 | 6 | 0.572 | 0.6346 | 0.901 |
| b7 | | | | | | | | |
| 1 | 6 | 6 | 10 | 0 | 0 | 1.13 | 0.760 | 1.486 |
| 2 | 6.5 | 6.5 | 20 | 0 | 0 | 1.12 | 0.763 | 1.467 |
| 3 | 7 | 7 | 20 | 0 | 0 | 1.09 | 0.761 | 1.431 |
| 4 | 10 | 10 | 20 | 0 | 0 | 0.953 | 0.822 | 1.159 |
| 5 | 30 | 26 | 10 | 0 | 4 | 0.715 | 0.739 | 0.967 |
| 6 | 30 | 23 | 0 | 2 | 5 | 0.659 | 0.713 | 0.924 |
| 7 | 30 | 20 | 0 | 4 | 6 | 0.581 | 0.693 | 0.838 |
| 8 | 30 | 15 | 0 | 8 | 7 | 0.579 | 0.634 | 0.912 |
| vb2 | | | | | | | | |
| 1 | 6 | 6 | 40 | 0 | 0 | 2.93 | 0.760 | 3.853 |
| 2 | 6.5 | 6.5 | 40 | 0 | 0 | 3 | 0.763 | 3.930 |
| 3 | 7 | 7 | 40 | 0 | 0 | 3.04 | 0.761 | 3.993 |
| 4 | 10 | 10 | 40 | 0 | 0 | 3.02 | 0.822 | 3.673 |
| 5 | 30 | 30 | 70 | 0 | 0 | 3.01 | 0.739 | 4.073 |
| 6 | 30 | 30 | 50 | 0 | 0 | 2.81 | 0.713 | 3.941 |
| 7 | 30 | 27 | 50 | 0 | 3 | 2.62 | 0.693 | 3.779 |
| 8 | 30 | 21 | 40 | 3 | 6 | 2.13 | 0.506 | 4.208 |
| vb4 | | | | | | | | |
| 1 | 6 | 6 | 50 | 0 | 0 | 3.51 | 0.760 | 4.616 |
| 2 | 6.5 | 6.5 | 60 | 0 | 0 | 3.56 | 0.763 | 4.663 |
| 3 | 7 | 7 | 80 | 0 | 0 | 3.6 | 0.761 | 4.728 |
| 4 | 10 | 10 | 70 | 0 | 0 | 3.61 | 0.822 | 4.391 |
| 5 | 30 | 30 | 90 | 0 | 0 | 3.57 | 0.739 | 4.830 |
| 6 | 30 | 30 | 70 | 0 | 0 | 3.46 | 0.713 | 4.852 |
| 7 | 30 | 30 | 100 | 0 | 0 | 3.25 | 0.693 | 4.68772537 |
| 8 | 30 | 29 | 90 | 1 | 0 | 2.52 | 0.634 | 3.97100536 |
| vb5 | | | | | | | | |
| 1 | 6 | 6 | 70 | 0 | 0 | 3.36 | 0.760 | 4.419 |
| 2 | 6.5 | 6.5 | 70 | 0 | 0 | 3.45 | 0.763 | 4.519 |
| 3 | 7 | 7 | 70 | 0 | 0 | 3.51 | 0.761 | 4.610 |
| 4 | 10 | 10 | 60 | 0 | 0 | 3.51 | 0.822 | 4.270 |
| 5 | 30 | 30 | 60 | 0 | 0 | 3.49 | 0.739 | 4.722 |
| 6 | 30 | 30 | 60 | 0 | 0 | 3.43 | 0.713 | 4.810 |
| 7 | 30 | 30 | 70 | 0 | 0 | 3.12 | 0.693 | 4.500 |
| 8 | 30 | 30 | 70 | 0 | 0 | 2.53 | 0.506 | 4.999 |
| vb6 | | | | | | | | |
| 1 | 6 | 6 | 100 | 0 | 0 | 2.76 | 0.760 | 3.630 |
| 2 | 6.5 | 6.5 | 80 | 0 | 0 | 2.86 | 0.763 | 3.746 |
| 3 | 7 | 7 | 90 | 0 | 0 | 3.14 | 0.761 | 4.124 |
| 4 | 10 | 10 | 100 | 0 | 0 | 3.3 | 0.822 | 4.014 |
| 5 | 30 | 30 | 80 | 0 | 0 | 3.29 | 0.739 | 4.451 |
| 6 | 30 | 30 | 60 | 0 | 0 | 3.12 | 0.713 | 4.375 |
| 7 | 30 | 30 | 40 | 0 | 0 | 2.82 | 0.693 | 4.067 |
| 8 | 30 | 30 | 30 | 0 | 0 | 2 | 0.506 | 3.951 |
| vb7 | | | | | | | | |
| 1 | 6 | 6 | 50 | 0 | 0 | 2.66 | 0.760 | 3.498 |
| 2 | 6.5 | 6.5 | 90 | 0 | 0 | 2.74 | 0.763 | 3.589 |
| 3 | 7 | 7 | 120 | 0 | 0 | 2.83 | 0.761 | 3.717 |
| 4 | 10 | 10 | 150 | 0 | 0 | 2.92 | 0.822 | 3.552 |
| 5 | 30 | 30 | 160 | 0 | 0 | 2.88 | 0.739 | 3.897 |
| 6 | 30 | 30 | 100 | 0 | 0 | 2.73 | 0.713 | 3.828 |
| 7 | 30 | 30 | 80 | 0 | 0 | 2.48 | 0.693 | 3.577 |
| 8 | 30 | 30 | 60 | 0 | 0 | 1.84 | 0.506 | 3.635 |

What is claimed is:

1. A method for detecting flaws in a conductive article comprising:

contacting a surface of said article with a non-linear array of probes comprising at least three voltage probes and at least three current probes;

selecting predetermined pairs of said current probes;

selecting predetermined pairs of said voltage probes;

passing current through said article by means of each of said predetermined pairs of said current probes, said current passing sequentially through each of said current probe pairs, one pair at a time, at varying directions to said voltage probes;

measuring voltage produced by each of said currents at predetermined locations on a surface of said article, said voltage measured between each of said pairs of said voltage probes for each current flow condition; and detecting the presence, location, size and orientation of flaws in said article, wherein the presence of said flaws in said article creates a detectable and statistically significant disturbance in a voltage profile generated from said voltages measured over said surface of said article, said disturbances indicative of the location, size, depth and orientation of said flaws.

2. The method of claim 1 further comprising the step of setting the duration of current flow between each of said pairs of current probes to no greater than one second.

3. The method of claim 1 further comprising the step of setting the current flow between said current probe pairs at a constant value between about 50 milliamps and about 5 amps.

4. The method of claim 1 wherein the array probe spacing is no greater than 0.1 inches.

5. The method of claim 1 wherein the probe array extends over an area of at least one square inch.

6. The method of claim 1 wherein the probes in the array are configured for a three-dimensional surface.

7. The method of claim 1 wherein the conductive article has a volume resistivity ranging from 10,000 microhm-cm to 80,000 microhm-cm.

8. The method of claim 1 for measuring flaws having a cross-sectional dimension ranging between about 10 um and 250 um.

9. The method of claim 1 wherein the probe spacing is non-uniform.

10. The method of claim 1 wherein the current probes are spaced around a perimeter of said voltage probes.

11. The method of claim 1 wherein said probe array has a two-dimensional shape selected from the group consisting of a triangle, a trapezoid, a circle, an ellipse, a square, a rectangle, a parallelogram and a random shape.

12. The method of claim 1 wherein said current is selected from a group consisting of direct current and alternating current.

13. The method of claim 1 further comprising the step of comparing the voltage profile measured over said surface of said article with a voltage profile measured over a surface of a flaw free baseline sample wherein differences in said measure voltage profiles are indicative of the location, size, depth and orientation of said flaws in said article.

14. A method for detecting flaws in a conductive article comprising:

contacting a surface of said article with a non-linear array of probes comprising at least three voltage probes and at least three current probes;

selecting predetermined pairs of said current probes;

passing current through said article by means of each of said pairs of current probes, said current passing sequentially through each of said current probe pairs, one pair at a time, at varying directions to said voltage probes;

measuring voltage produced by each of said currents at predetermined locations on a surface of said article, said voltage measured for each current flow condition between each of said voltage probes and a reference voltage; and detecting the presence, location size and orientation of flaws in said article, wherein the presence of said flaws in said article creates a detectable and statistically significant disturbance in a voltage profile generated from said voltages measured over said surface of said article, said disturbances indicative of the location, size, depth and orientation of said flaws.

15. The method of claim 14 further comprising the step of comparing the voltage profile measured over said surface of said article with a voltage profile measured over a surface of a flaw free baseline sample wherein differences in said measure voltage profiles are indicative of the location, size, depth and orientation of said flaws in said article.

16. An apparatus for detecting the location of flaws in a conductive article comprising:

an adaptable probe assembly for electrically contacting a surface of said article with a nonlinear array of at least six probes, said probes comprising at least three current probes and at least three voltage probes;

a means for selecting predetermined pairs of current probes;

a current source for producing a current flow between each of said pairs of said current probes, said current flowing through one pair of said probes at a time, said current flow between each current probe pair creating a unique current flow direction;

a means for selecting predetermined pairs of voltage probes;

a means for measuring a voltage profile of said surface, said profile generated from a plurality of voltages measured between said pairs of voltage probes for each current flow condition; and a means for detecting disturbances in said voltage profile, said disturbances due to the presence of flaws in said article, said disturbances indicating the presence, location, size, and orientation of said flaws in said article.

17. The apparatus of claim 16 wherein said means for selecting said current probes comprises a current multiplexer and said means for selecting said voltage probes comprises a voltage multiplexer.

18. The apparatus of claim 16 wherein said current probes and said voltage probes are slideably mounted in said probe assembly to accommodate said surface of said article, said current and said voltage probes being urged against said surface by a forcing means to maintain electrical contact with said surface.

19. The apparatus of claim wherein said means for detecting disturbances in said voltage profile comprises a programmable computer interfaced with said apparatus by way of a data acquisition board, said computer programmed for comparing said profile with a voltage profile for a flaw-free sample to determine differences in said profiles, said computer programmed with a statistical distribution model to calculate a probability of said differences in said profiles being indicative of a flaw in said article.

20. The apparatus of claim 16 wherein the array probe spacing is no greater than 0.1 inches.

21. The apparatus of claim 16 wherein the probe array extends over an area of at least one square inch.

22. The apparatus of claim 16 wherein the probes in the array are configured for contacting a three-dimensional surface.

23. The apparatus of claim 16 wherein the probe spacing is non-uniform.

24. The apparatus of claim 16 wherein the current probes are spaced around a perimeter of said voltage probes.

25. The apparatus of claim 16 wherein said probe array has a two-dimensional shape selected from the group consisting of a triangle, a trapezoid, a circle, an ellipse, a square, a rectangle, a parallelogram and a random shape.

26. The apparatus of claim 16 wherein said current is maintained at a constant value between about 50 milliamps and about 5 amps and the current is selected from a group consisting of direct current and alternating current.

27. The method of claim 16 further comprising the step of setting the duration of current flow between each of said current probes to no greater than one second.

28. A probe array for detecting the location of physical flaws in a conductive article comprising: a probe housing;
   at least three voltage probes deployed in said housing in a non-linear configuration having at least two-dimensions, said voltage probes adaptively configured for making electrical contact with a surface of said article; and
   at least three current probes deployed in said housing in a non-linear configuration having at least two dimensions, said current probes adaptively configured for making electrical contact and injecting current into said surface of said article.

29. The probe array of claim 28 wherein said voltage probes and said current probes are deployed in a three-dimensional configuration for contacting a non-planar surface.

30. The probe array of claim 28 wherein said voltage and current probes are deployed in a shaped configuration selected from the group consisting of a triangle, a trapezoid, a square, a rectangle, a parallelogram, a circle, an ellipse and a random shape.

31. The probe array of claim 28 wherein the spacing of said voltage and current probes is no greater than 0.1 inch and said probe array extends over an area of at least one square inch.

32. The probe array of claim 31 comprising at least 64 voltage probes and at least eight current probes.

33. The probe array of claim 32 wherein said probe array is rectilinear and said current probes are spaced around a perimeter of said voltage probes.

* * * * *